(12) United States Patent
Kung et al.

(10) Patent No.: US 12,191,621 B2
(45) Date of Patent: Jan. 7, 2025

(54) LIGHT SOURCE GENERATION APPARATUS, LIGHT SOURCE GENERATING METHOD, AND RELATED DEFECT DETECTION SYSTEM

(71) Applicant: NATIONAL TSING HUA UNIVERSITY, Hsinchu (TW)

(72) Inventors: Andrew Hing Cheong Kung, Taipei (TW); Pei-Chi Huang, Yunlin County (TW); Chih-Hsuan Lu, Hsinchu (TW); Ming-Chang Chen, Kaohsiung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 189 days.

(21) Appl. No.: 17/988,276

(22) Filed: Nov. 16, 2022

(65) Prior Publication Data

US 2023/0136618 A1 May 4, 2023

Related U.S. Application Data

(63) Continuation of application No. PCT/US2020/037128, filed on Jun. 11, 2020.

(51) Int. Cl.
*H01S 3/00* (2006.01)
*G01N 21/47* (2006.01)
(Continued)

(52) U.S. Cl.
CPC ....... *H01S 3/0057* (2013.01); *G01N 21/4788* (2013.01); *G02F 1/354* (2021.01);
(Continued)

(58) Field of Classification Search
None
See application file for complete search history.

(56) References Cited

U.S. PATENT DOCUMENTS 11,477,877 B2 * 10/2022 Nagano ............... G21K 1/062
2008/0013163 A1 1/2008 Leonardo et al.
(Continued)

FOREIGN PATENT DOCUMENTS

CN 104283097 A 1/2015
CN 105305209 B 7/2018
(Continued)

OTHER PUBLICATIONS

Tsai, C-L., et al., "Nonlinear Compression of Intense Optical Pulses at 1.55 μm by Multiple Plate Continuum Generation", J Lightwave Tech., 37(19), 5100-5107.

*Primary Examiner* — Marcus H Taningco
(74) *Attorney, Agent, or Firm* — Joseph C. Zucchero; Carolyn S. Elmore; Elmore Patent Law Group, P.C.

(57) ABSTRACT

An EUV radiation light source generation apparatus includes a pump laser, at least one pulse shaping unit, a wavelength conversion unit, and a high-order harmonics generation unit. The pump laser provides a pulse laser radiation beam. Each pulse shaping unit conducts a spectrum extending operation and a phase compensation operation to the pulse laser radiation beam. The phase compensation operation makes multiple frequency components of the pulse laser radiation beam emitted by the pulse shaping unit to be substantially in phase. The wavelength conversion unit conducts a center wavelength conversion operation to the pulse laser radiation beam. The high-order harmonics generation unit receives the pulse laser radiation beam processed by the pulse shaping unit and the center wavelength conversion operation, and focuses the received pulse laser radiation beam to a high order harmonic generation medium to generate a high order harmonic radiation beam.

22 Claims, 18 Drawing Sheets

(51) Int. Cl.
*G02F 1/35* (2006.01)
*G03F 7/00* (2006.01)
*H01S 3/16* (2006.01)

(52) U.S. Cl.
CPC ...... *G03F 7/70025* (2013.01); *G03F 7/70041* (2013.01); *G03F 7/7065* (2013.01); *H01S 3/0092* (2013.01); *G01N 2201/06113* (2013.01); *H01S 3/1618* (2013.01); *H01S 3/1625* (2013.01); *H01S 3/1636* (2013.01); *H01S 3/1643* (2013.01)

(56) References Cited

U.S. PATENT DOCUMENTS

| | | | |
|---|---|---|---|
| 2010/0181503 A1* | 7/2010 | Yanagida | G03F 7/70916 250/504 R |
| 2012/0146507 A1 | 6/2012 | Yanagida et al. | |
| 2012/0154902 A1* | 6/2012 | Boullet | H01S 3/0057 359/328 |
| 2016/0161825 A1 | 6/2016 | Kung et al. | |
| 2016/0254121 A1 | 9/2016 | Amir | |
| 2016/0315442 A1 | 10/2016 | Popmintchev et al. | |
| 2018/0034230 A1 | 2/2018 | Leonardo et al. | |

FOREIGN PATENT DOCUMENTS

| | | | |
|---|---|---|---|
| CN | 110289538 A | * | 9/2019 |
| EP | 3582009 A1 | | 12/2019 |
| JP | 2002131710 A | | 5/2002 |
| JP | 2007110089 A | | 4/2007 |
| JP | 2007256388 A | | 10/2007 |
| JP | 2009544049 A | | 12/2009 |
| JP | 2012530929 A | | 12/2012 |
| JP | 2013515357 A | | 5/2013 |
| JP | 2015118244 A | | 6/2015 |
| JP | 2017513041 A | | 5/2017 |
| JP | 2017516160 A | | 6/2017 |
| TW | 201920919 A | | 6/2019 |
| WO | 2008008678 A2 | | 1/2008 |
| WO | 2011122689 A1 | | 10/2011 |

\* cited by examiner

LIGHT SOURCE GENERATION APPARATUS, LIGHT SOURCE GENERATING METHOD, AND RELATED DEFECT DETECTION SYSTEM

RELATED APPLICATIONS

This application is continuation of International Application No. PCT/US2020/037128, filed Jun. 11, 2020, the content of which are incorporated herein by reference.

BACKGROUND

Field of Invention

The present disclosure generally relates to semiconductor equipment. More particularly, the present disclosure relates to an extreme ultraviolet (EUV) radiation light source generation apparatus.

Description of Related Art

Lithography is the foundation of the semiconductor industry. The rapid development of the semiconductor industry can be attributed to the rapid development of the lithography. When facing the growing quantity of logic gates in an integrated circuit, the conventional manufacturing process is, however, under severe challenge.

Among different lithography technologies, photo lithography is the most important one. Photo lithography aligns a radiation source to an exposure target through a patterned mask (e.g., a photo mask or a reticle) so as to project the circuit pattern drawn on the mask to a corresponding location of a substrate (e.g., a wafer) coated with light-sensitive material (e.g., the photo resist). Since photo lithography is cost-effective and suitable for being integrated into mass production and processing applications of the semiconductor, photo lithography process and related apparatus will remain their key positions in the semiconductor industry under continuous development of advanced processes.

Optical lithography used in semiconductors has the following requirements, including: high resolution (e.g., accurately adjusting the focal point), reducing the exposure wavelength and also increasing the numerical aperture (NA) of lens, high-sensitivity photosensitive materials, alignment accuracy, precise process parameter control, and low defect density (e.g., by detecting masks in advance to improve exposure yield).

The feature size of the lithography process pattern is limited by the wavelength of the projected radiation source, and thus more and more advanced processes use deep ultraviolet (DUV) or extreme ultraviolet (EUV) as the radiation source of lithography. As a result, research topics regarding to photoresist materials applied to the EUV process, defect detection, and mask protective pellicles with enhanced transparency flourish.

The feature size of the EUV process can be less than 10 nanometer (nm). If a conventional laser of longer wavelength (e.g., 193 nm) or a deep ultraviolet light is used as the detection radiation source, subtle defects on the mask may not be observed. The industry usually uses laser produced plasma (LPP) or discharged produced plasma (DPP) to generate incoherent EUV radiation sources. However, defect detection using incoherent light requires additional optical elements to gather light, reducing optical converting efficiency and also increasing complexity and difficulty of defect detection. The plasma generation process also causes a lot of pollution.

SUMMARY

The disclosure provides an extreme-ultraviolet (EUV) radiation light source generation apparatus including a pump laser, at least one pulse shaping unit, a wavelength conversion unit, and a high-order harmonics generation unit. The pump laser is configured to provide a pulse laser radiation beam. Each one of the at least one pulse shaping unit is configured to conduct a spectrum extending operation and a phase compensation operation to the pulse laser radiation beam, and the phase compensation operation is configured to make a plurality of frequency components of the pulse laser radiation beam emitted by the pulse shaping unit to be substantially in phase. The wavelength conversion unit is configured to conduct a center wavelength conversion operation to the pulse laser radiation beam. The high-order harmonics generation unit is configured to receive the pulse laser radiation beam processed by the at least one pulse shaping unit and the center wavelength conversion operation, and is configured to focus the received pulse laser radiation beam to a high order harmonic generation medium to generate a high order harmonic radiation beam.

The disclosure provides an EUV radiation light source generating method including the following operations: utilizing a pump laser to provide a pulse laser radiation beam to an optical propagation path, wherein the pulse laser radiation beam has a first pulse duration; conducting a center wavelength conversion operation on the optical propagation path, so as to convert a first center wavelength of the pulse laser radiation beam to a second center wavelength, wherein the first center wavelength is different from the second center wavelength; conducting a first spectrum extending operation on the optical propagation path, so as to extend a first bandwidth of the pulse laser radiation beam to a second bandwidth, wherein the first bandwidth is smaller than the second bandwidth; conducting a first phase compensation operation on the optical propagation path, wherein the first phase compensation operation is configured to make a plurality of frequency components of the pulse laser radiation beam having the second bandwidth substantially in phase, the pulse laser radiation beam processed by the first phase compensation operation has a second pulse duration, and the first pulse duration is greater than the second pulse duration; focusing the pulse laser radiation beam, processed by the first spectrum extending operation, the first phase compensation operation, and the center wavelength conversion operation, to a high order harmonic generation medium to generate a high order harmonic radiation beam.

The disclosure provides a defect detection system including an EUV radiation light source generation apparatus and a defect detection apparatus. The EUV radiation light source generation apparatus includes a pump laser, at least one pulse shaping unit, a wavelength conversion unit, and a high-order harmonics generation unit. The pump laser is configured to provide a pulse laser radiation beam. Each one of the at least one pulse shaping unit is configured to conduct a spectrum extending operation and a phase compensation operation to the pulse laser radiation beam, and the phase compensation operation is configured to make a plurality of frequency components of the pulse laser radiation beam emitted by the pulse shaping unit to be substantially in phase. The wavelength conversion unit is configured to conduct a center wavelength conversion operation to the pulse laser radiation beam. The high-order harmonics generation unit is configured to receive the pulse laser radiation beam processed by the at least one pulse shaping unit and the center wavelength conversion operation, and is configured to focus the received pulse laser radiation beam to a high order harmonic generation medium to generate a high order harmonic radiation beam. The defect detection apparatus includes a testing platform, a detection unit, and an analysis unit. The testing platform is configured to set a sample under test, and the high order harmonic radiation beam is configured to be incident to the sample under test by a predetermined angle of incidence. The detection unit is configured to detect a diffraction result of the high order harmonic radiation beam diffracting the sample under test. The analysis unit is electrically coupled to the detection unit, and is configured to construct an image corresponding to the sample under test according to the diffraction result.

It is to be understood that both the foregoing general description and the following detailed description are by examples, and are intended to provide further explanation of the disclosure as claimed.

DETAILED DESCRIPTION

Figure 1:
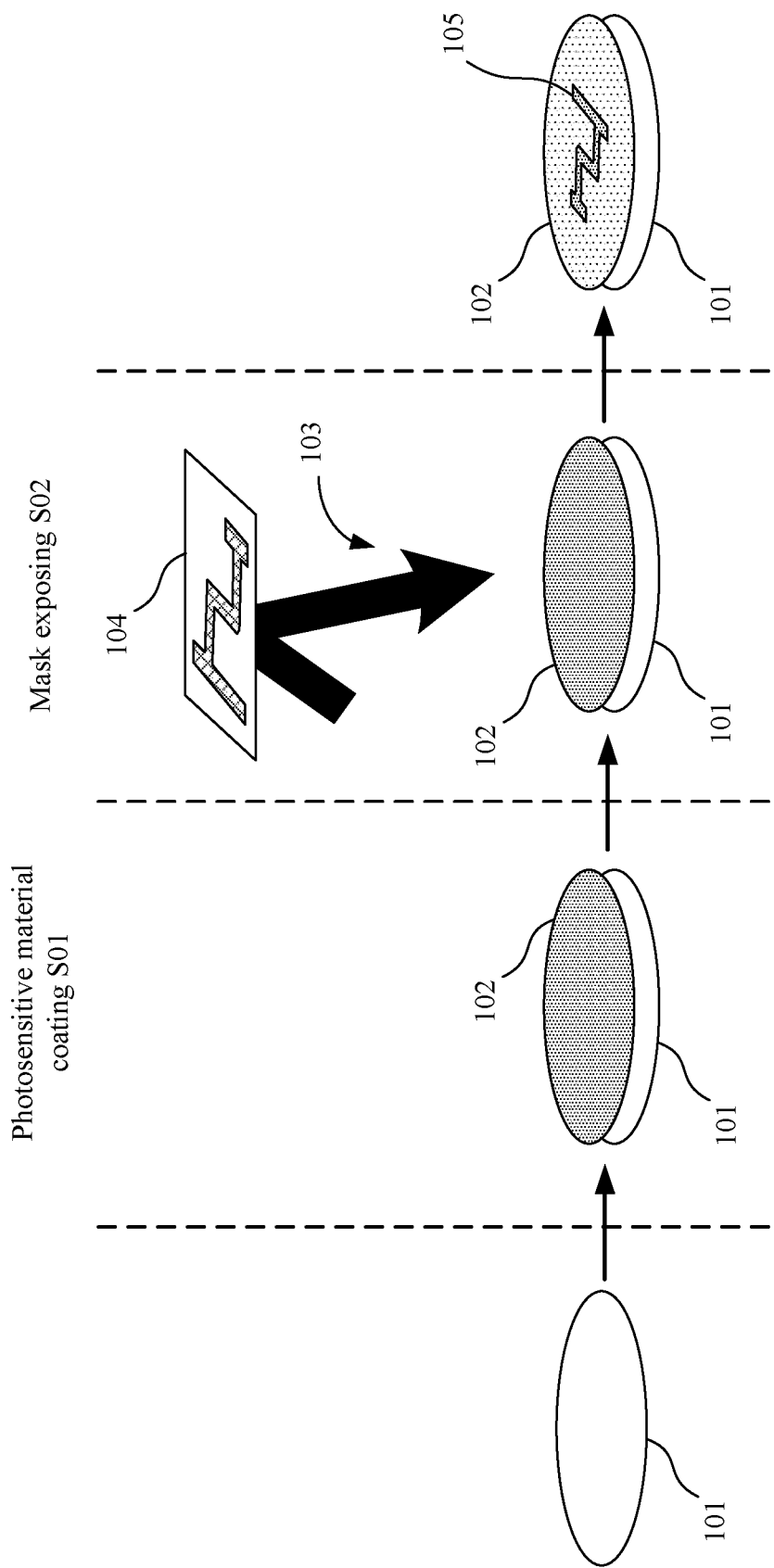
FIG. 1 is a schematic diagram for illustrating the semiconductor manufacturing process according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The extreme ultraviolet (EUV) light recited in this disclosure may comprise electromagnetic radiation having wavelength substantially of 5 to 100 nanometer (nm).

The exposure wavelength of EUV lithography recited in this disclosure may substantially be 13.5 nm, or substantially be in the band of EUV having a range of 13.5 nm plus/minus 2%.

The detection wavelength recited in this disclosure may substantially be 10~120 nm.

The terms substrate and patterned substrate recited in this disclosure may refer to a non-patterned wafer or a patterned wafer.

The term mask recited in this disclosure may refer to a reticle or a reticle having a pellicle.

Provided herein are explanations in respect of reference labels used in embodiments of this disclosure. The same reference labels are used to refer to the same or like elements, for example, a pulse laser radiation beam received by a continuum unit is having a reference label L, and a pulse laser radiation beam emitted by the continuum unit having a reference label L'. As another example, a pulse laser radiation beam received by the pulse compression unit having a reference label L', and a pulse laser radiation beam emitted by the pulse compression unit having a reference label L".

The pulse laser radiation beam L recited in this disclosure has a bandwidth β, a wavelength λ, and a pulse duration t which are referred to by a corresponding index. For instance, a pulse laser radiation beam L1 has a bandwidth β1, a wavelength λ1, a pulse duration t1. As another instance, a pulse laser radiation beam L2 has a bandwidth β2, a wavelength λ2, and a pulse duration t2, and so forth.

The term bandwidth recited in this disclosure may represent the full width at half maximum (FWHM) of a waveform in frequency domain of a pulse laser.

The term pulse duration recited in this disclosure may represent the full width at half maximum (FWHM) of a waveform in time domain of a pulse laser.

The optical propagation path, recited in this disclosure, of an extreme-ultraviolet (EUV) radiation light source generation apparatus may comprise a plurality of pulse laser radiation beams.

FIG. 1 is a schematic diagram for illustrating the semiconductor manufacturing process according to one embodiment of the present disclosure. As shown in FIG. 1, the semiconductor manufacturing process comprises photoresist coating and EUV lithography. First of all, the substrate 101 enters a photosensitive material coating operation (operation S01) so that the photoresist 102 is coated on the substrate 101. Then, the substrate 101 enters a mask exposing operation of the EUV lithography (operation S02) so as to use the EUV light 103 and the mask 104 to etch the pattern 105 onto the substrate 101. The EUV light 103 may be a plasma state light source generated by the laser-produced plasma (LPP) method or the discharge-produced plasma (DPP) method. Since the plasma state light source is incoherent and non-collimated, a great quantity of optical elements (e.g., reflective mirror, filters, light collector, etc.) are required to gather light having center wavelength substantially equal to 13.5 nm. Furthermore, optical elements has low reflect efficiency of the EUV light source due to characteristics of the EUV light source, and therefore the plasma state EUV light source usually accompanies by great power loss. The minimum feature size of patterns of the EUV lithography is smaller than 10 nm, causing strict requirements toward the design and detect of the patterns on the mask. A slightly defect on the mask, misalignment between the mask and the substrate, and other optical interferences affect the exposing quality of the EUV lithography or the related mask detection quality.

It is worth mentioning that incoherent light source requires more optical elements, causing optical interferences in greater chance during mask detecting so as to affect mask detection quality. Therefore, incoherent light source is not suitable for the at—wavelength optical metrology. High-order harmonics generation (HHG) may be used to generate coherent EUV light, but the coherent EUV light generated by this method has low average intensity. Therefore, this disclosure provides EUV radiation light source generation apparatuses and EUV radiation light source generating methods capable for providing a high power EUV light, and related apparatuses and methods, utilizing the high power EUV light, for performing the at—wavelength optical metrology.

Figure 2:
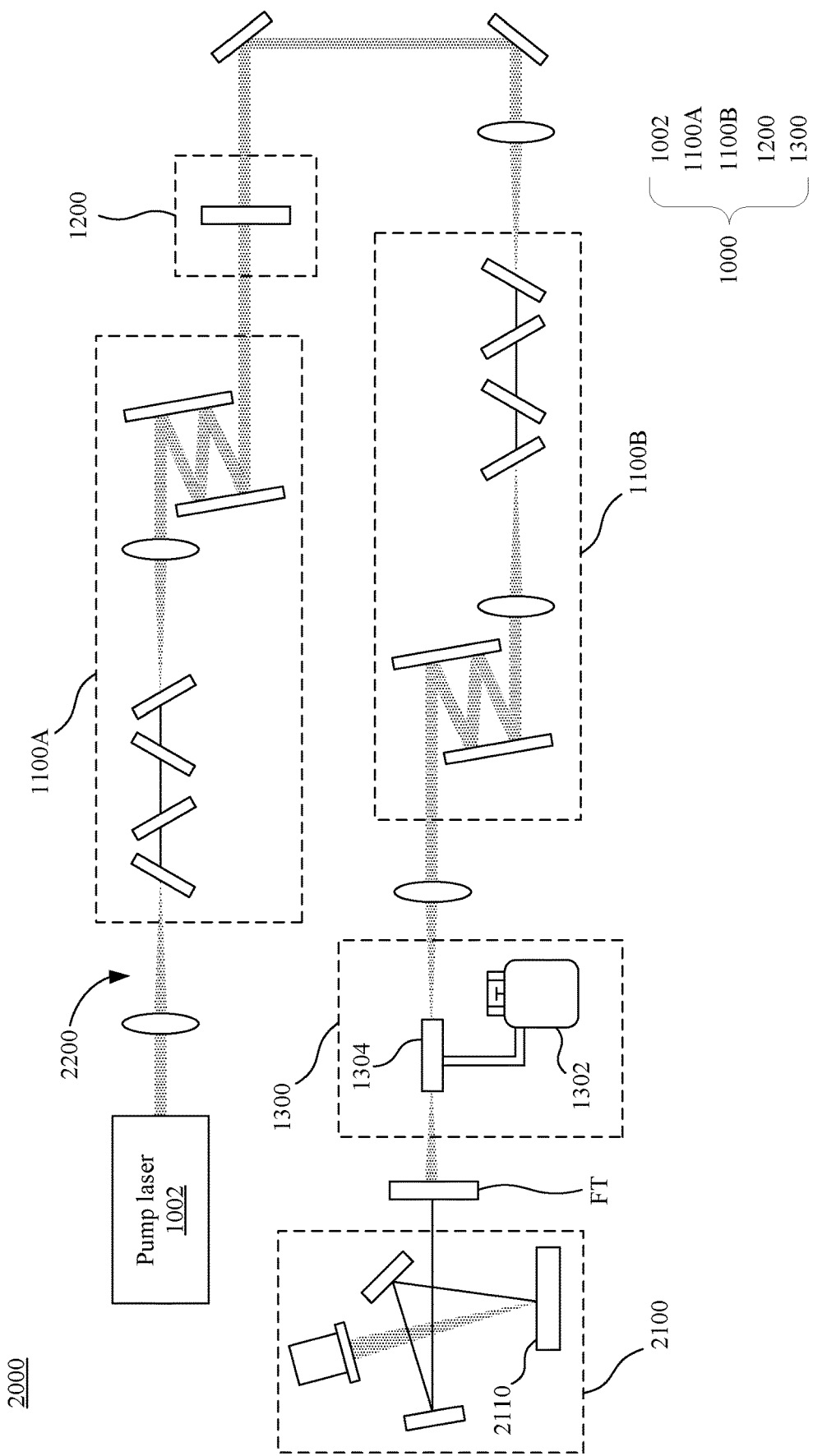
FIG. 2 is a simplified functional block diagram of a defect detection system according to one embodiment of the present disclosure.

FIG. 2 is a simplified functional block diagram of a defect detection system 2000 according to one embodiment of the present disclosure. As shown in FIG. 2, the defect detection system 2000 comprises an EUV radiation light source generation apparatus 1000 and a defect detection apparatus 2100. The EUV radiation light source generation apparatus 1000 comprises a pump laser 1002 arranged on an optical propagation path 2200, at least one pulse shaping unit (e.g., pulse shaping units 1100A and 1100B), a wavelength conversion unit 1200, and a high-order harmonics generation unit 1300.

In the situation that the number of the at least one pulse shaping unit is 1, the pulse shaping unit 1100A (or the pulse shaping unit 1100B) may be arranged between the pump laser 1002 and the wavelength conversion unit 1200, or between the wavelength conversion unit 1200 and the high-order harmonics generation unit 1300. In another situation that the number of the at least one pulse shaping unit is more than 2, the pulse shaping units 1100A and 1100B may be respectively arranged between the pump laser 1002 and the wavelength conversion unit 1200 and between the wavelength conversion unit 1200 and the high-order harmonics generation unit 1300.

The pulse shaping units 1100A and 1100B are configured to perform spectrum extending and phase compensation to the pulse laser radiation beam on the optical propagation path 2200, thereby reducing the pulse duration of the pulse laser radiation beam to improve the peak intensity of the pulse laser radiation beam. The wavelength conversion unit 1200 is configured to adjust the center wavelength of the pulse laser radiation beam on the optical propagation path 2200. The high-order harmonics generation unit 1300 is configured to receive the pulse laser radiation beam whose peak intensity and center wavelength has been adjusted, and configured to generate, according to the received pulse laser radiation beam, high power EUV light suitable for mask detection. The defect detection apparatus 2100 is configured to receive EUV light from the high-order harmonics generation unit 1300, and configured to detect the sample under test 2110 by using the EUV light. The number and location of the pulse shaping unit may be determined in accordance with practical design requirements, which will be described in the following paragraphs.

In some embodiments, the pump laser 1002 may be realized by Yb: YAG laser or the Ti: sapphire laser. In one embodiment, the pump laser 1002 comprising the Yb: YAG has an output wavelength of 1030 nm and a pulse duration of 240 femtosecond (fs). In one embodiment, the pump laser 1002 comprising the Ti: sapphire has an output wavelength of 800 nm and a pulse duration of 30 femtosecond (fs), but this disclosure is not limited thereto. Notably, the laser gain medium of the pump laser 1002 may be selected according to the repetition rate and the peak intensity of the pump laser 1002 so that the average intensity of the pump laser 1002 is substantially greater than 1 watt (W). In one embodiment, the repetition rate of the pump laser 1002 is substantially from 1 kHz to 1 MHZ. In addition, additional optical elements may be arranged, according to practical design requirements, between any two components of the defect detection system 2000, in order to change optical propagation path 2200 or to focus the pulse laser radiation beam. For example, optical elements such as lens, concave mirror, parabolic mirror, and reflective mirror may be used, but this disclosure is not limited thereto.

It worth mentioning that the high-order harmonics generation unit 1300 comprises the gas transmission unit 1302 and the gas cell 1304. The gas transmission unit 1302 is configured to provide the high order harmonic generation medium (e.g., inert gas target material) into the gas cell 1304, and the high-order harmonics generation unit 1300 focuses the received pulse laser radiation beam to the high order harmonic generation medium in the gas cell 1304. Operation of the high-order harmonics generation unit 1300 will be further described in the following paragraphs.

In one embodiment, the high-order harmonics generation unit 1300 and the defect detection apparatus 2100 is operated in a vacuum environment.

In another embodiment, the EUV radiation light source generation apparatus 1000 further comprises a filtering unit FT. The filtering unit FT is configured to filter EUV light of certain wavelengths and infrared light in the pulse laser radiation beam generated by the high-order harmonics generation unit 1300, and configured to preserve EUV light having specific wavelengths (e.g., 13.5 nm). In practice, the filtering unit FT may be realized by the metallic film, high reflective multilayer mirror for specific light wavelengths, or a combination of spectrometer and aperture.

Figure 3:
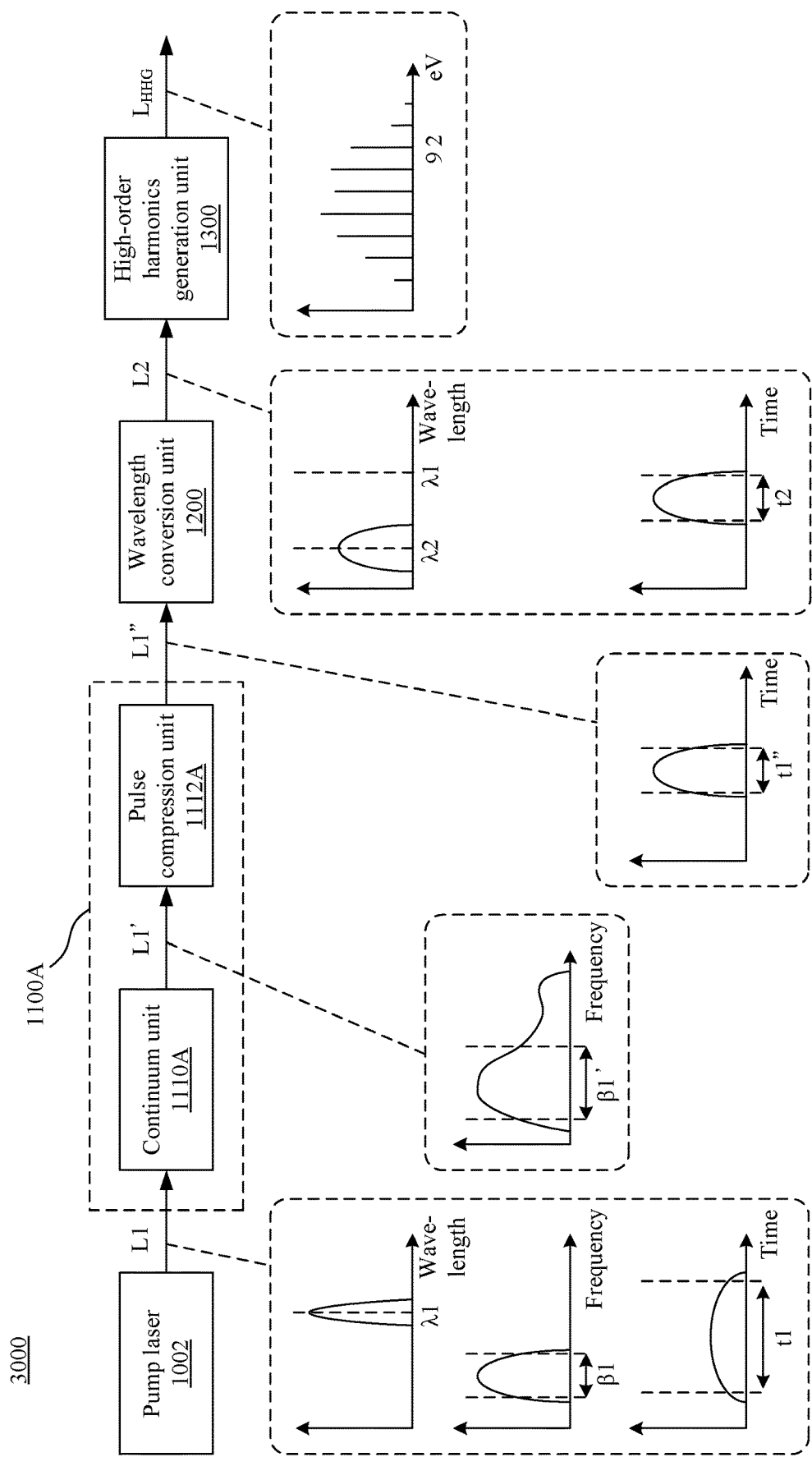
FIG. 3 is a simplified functional block diagram of an EUV radiation light source generation apparatus according to one embodiment of the present disclosure.

FIG. 3 is a simplified functional block diagram of an EUV radiation light source generation apparatus 3000 according to one embodiment of the present disclosure. The EUV radiation light source generation apparatus 3000 of FIG. 3 may be used to realize the EUV radiation light source generation apparatus 1000 of FIG. 2. As shown in FIG. 3, the EUV radiation light source generation apparatus 3000 comprises a pump laser 1002, a pulse shaping unit 1100A, a wavelength conversion unit 1200, and high-order harmonics generation unit 1300 which are arranged in sequence on a light transmission path of the EUV radiation light source generation apparatus 3000, wherein the pulse shaping unit 1100A comprises continuum unit 1110A and pulse compression unit 1112A. For the sake of brevity, part of the light transmission path of the EUV radiation light source generation apparatus 3000 is omitted in FIG. 3.

In this embodiment, the pump laser 1002 is configured to generate a pulse laser radiation beam L1 having a center wavelength $\lambda 1$, a bandwidth $\beta 1$, and a pulse duration t1. The continuum unit 1110A is configured to receive the pulse laser radiation beam L1, and to emit a pulse laser radiation beam L1' having a bandwidth $\beta 1'$ greater than bandwidth $\beta 1$. The pulse compression unit 1112A is configured to receive the pulse laser radiation beam L1', and to emit a pulse laser radiation beam L1" having a pulse duration t1" smaller than the pulse duration of the pulse laser radiation beam L1'. The wavelength conversion unit 1200 is configured to receive the pulse laser radiation beam L1", and to emit the pulse laser radiation beam L2 having a center wavelength $\lambda 2$ larger than or smaller than the center wavelength $\lambda 1$. The high-order harmonics generation unit 1300 is configured to receive the pulse laser radiation beam L2, and to generate a pulse laser radiation beam LHHG reaching specific electron volts (eV) (e.g., 92 eV) by using the pulse laser radiation beam L2.

In one embodiment, the center wavelength $\lambda 1$ of the pulse laser radiation beam L1 may be 1030 nm, and the pulse duration t1 may be approximately in a range of 200 fs to 2 picoseconds (ps), but this disclosure is not limited thereto. It should be understood that any other suitable types of pump laser 1002 may be used as will be apparent to those of ordinary skill in the art in view of the teachings herein.

Figure 4:
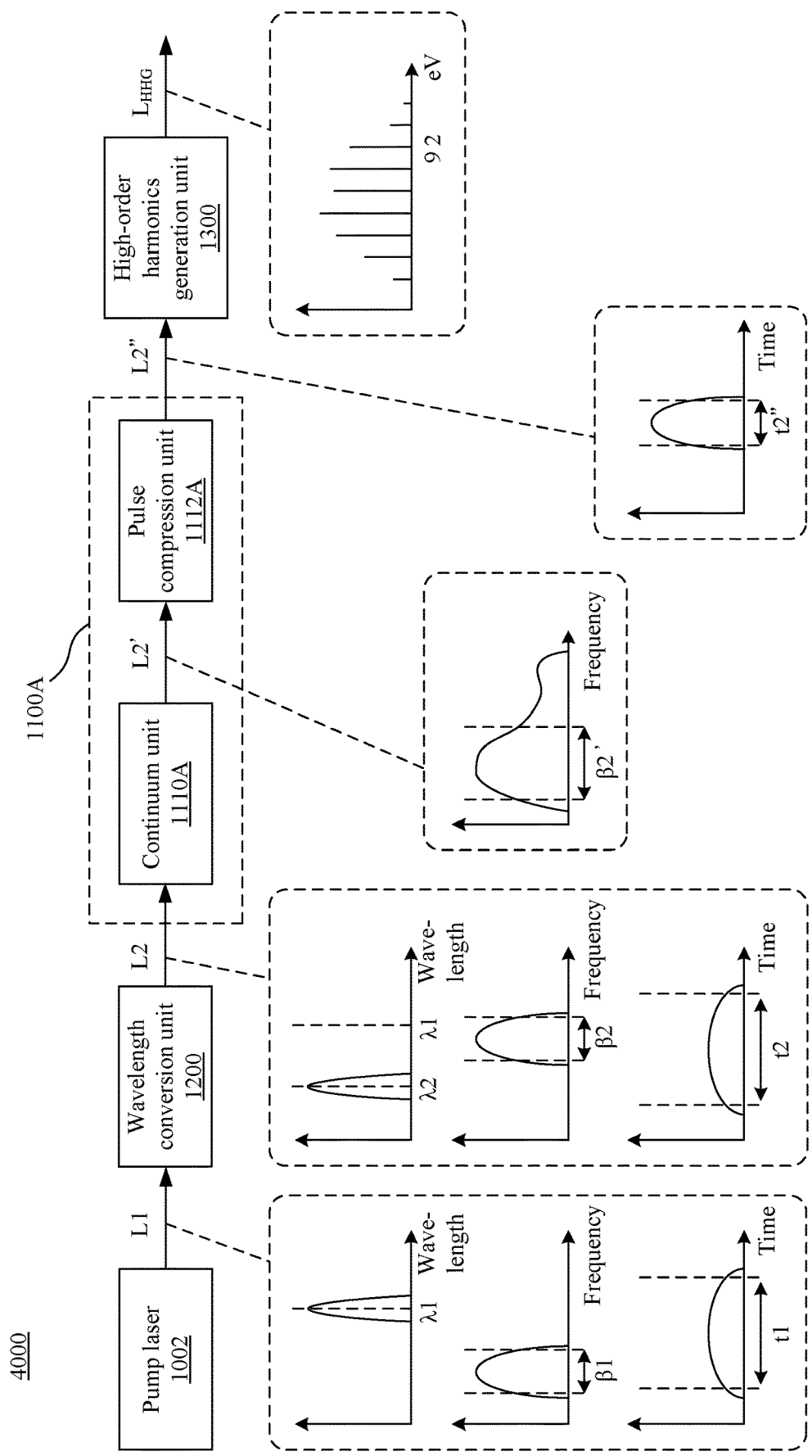
FIG. 4 is a simplified functional block diagram of an EUV radiation light source generation apparatus according to one embodiment of the present disclosure.

FIG. 4 is a simplified functional block diagram of an EUV radiation light source generation apparatus 4000 according to one embodiment of the present disclosure. As shown in FIG. 4, the EUV radiation light source generation apparatus 4000 comprises a pump laser 1002, a wavelength conversion unit 1200, a pulse shaping unit 1100A, and a high-order harmonics generation unit 1300 arranged in sequence on an optical propagation path of the EUV radiation light source generation apparatus 4000, that is, the wavelength conversion unit 1200 is arranged between the pulse shaping unit 1100A and the pump laser 1002.

The pump laser 1002 is configured to generate the pulse laser radiation beam L1 having the center wavelength $\lambda 1$, the bandwidth $\beta 1$, and the pulse duration t1. The wavelength conversion unit 1200 is configured to receive the pulse laser radiation beam L1, and configured to emit the pulse laser radiation beam L2 having the center wavelength $\lambda 2$, the pulse duration t2, and the bandwidth $\beta 2$, in the event that the center wavelength $\lambda 2$ may be larger than or smaller than the center wavelength $\lambda 1$. The continuum unit 1110A is configured to receive the pulse laser radiation beam L2, and configured to emit the pulse laser radiation beam L2' having the bandwidth $\beta 2'$, in the event that the bandwidth $\beta 2'$ is greater than the bandwidth $\beta 2$ and the pulse duration of the pulse laser radiation beam L2' is smaller than the pulse duration t2. The pulse compression unit 1112A is configured to receive the pulse laser radiation beam L2' emitted by the continuum unit 1110A, and emit the pulse laser radiation beam L2" having the pulse duration t2", in the event that the pulse duration t2" is smaller than the pulse duration of the pulse laser radiation beam L2'. The high-order harmonics generation unit 1300 is configured to receive the pulse laser radiation beam L2", and configured to emit the pulse laser radiation beam LHHG reaching specific electron volts according to the pulse laser radiation beam L2".

Figure 5:
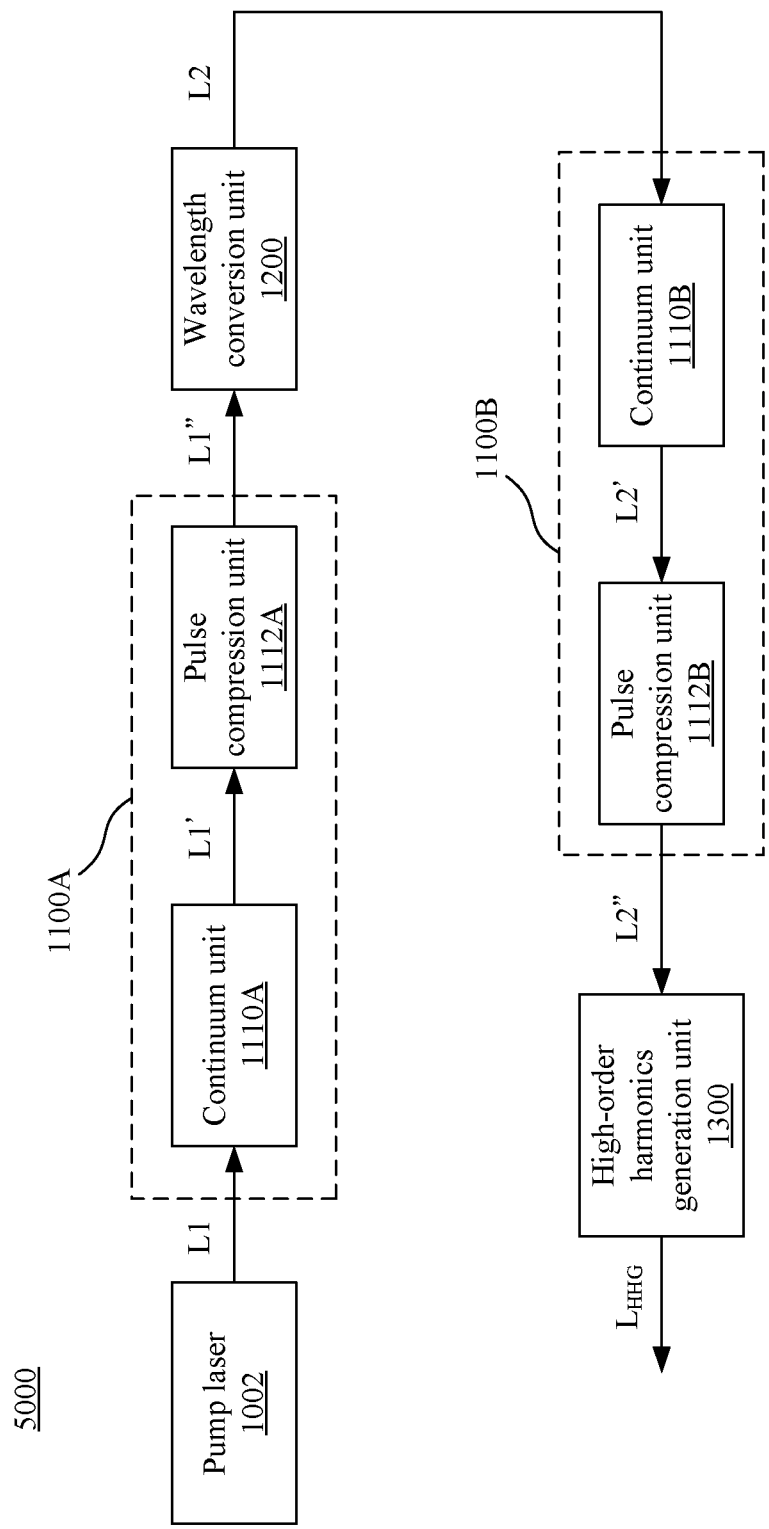
FIG. 5 is a simplified functional block diagram of an EUV radiation light source generation apparatus according to one embodiment of the present disclosure.

FIG. 5 is a simplified functional block diagram of an EUV radiation light source generation apparatus 5000 according to one embodiment of the present disclosure. The EUV radiation light source generation apparatus 5000 of FIG. 5 is similar to the EUV radiation light source generation apparatus 3000 of FIG. 3, the difference is that the EUV radiation light source generation apparatus 5000 of FIG. 5 further comprises a pulse shaping unit 1100B. The pulse shaping unit 1100B is arranged on the light transmission path of the EUV radiation light source generation apparatus 5000, and is located between the wavelength conversion unit 1200 and the high-order harmonics generation unit 1300. The pulse shaping unit 1100B comprises a continuum unit 1110B and a pulse compression unit 1112B. The continuum unit 1110B is configured to receive the pulse laser radiation beam L2 emitted by the wavelength conversion unit 1200, and configured to emit the pulse laser radiation beam L2' having the bandwidth $\beta 2'$. The bandwidth $\beta 2'$ of the pulse laser radiation beam L2' is larger than the bandwidth $\beta 2$ of the pulse laser radiation beam L2, and the pulse duration of the pulse laser radiation beam L2' is smaller than the pulse duration t2 of the pulse laser radiation beam L2.

The foregoing descriptions regarding the implementations, connections, operations, and related advantages of other corresponding functional blocks in the EUV radiation light source generation apparatus 3000 are also applicable to the EUV radiation light source generation apparatus 5000. For the sake of brevity, those descriptions will not be repeated here.

Figure 6:
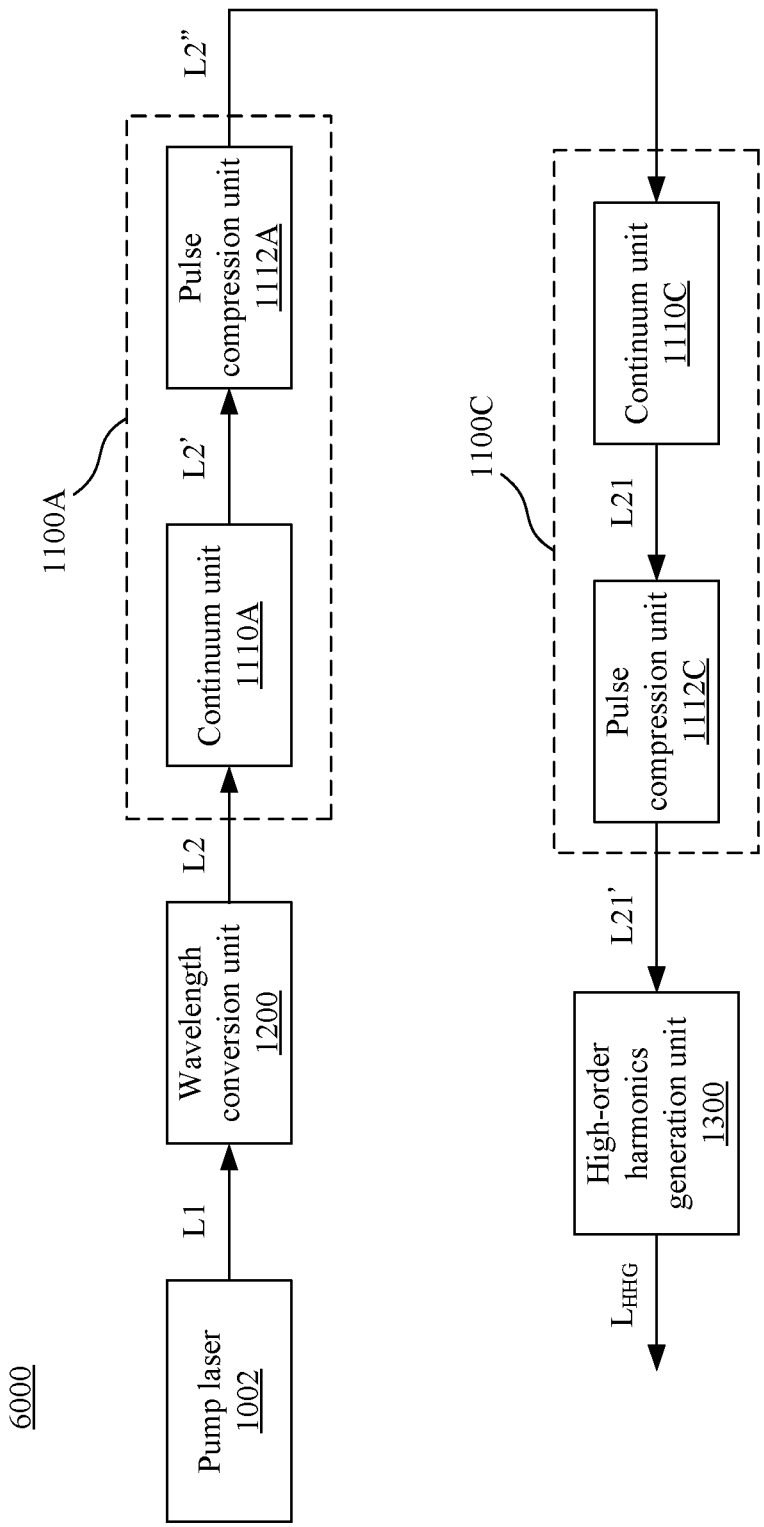
FIG. 6 is a simplified functional block diagram of an EUV radiation light source generation apparatus according to one embodiment of the present disclosure.

FIG. 6 is a simplified functional block diagram of an EUV radiation light source generation apparatus 6000 according to one embodiment of the present disclosure. The EUV radiation light source generation apparatus 6000 of FIG. 6 is similar to the EUV radiation light source generation apparatus 4000 of FIG. 4, the difference is that the EUV radiation light source generation apparatus 6000 of FIG. 6 further comprises a pulse shaping unit 1100C. The pulse shaping unit 1100C is arranged on the light transmission path of the EUV radiation light source generation apparatus 6000, and is located between the pulse shaping unit 1100A and the high-order harmonics generation unit 1300. The pulse shaping unit 1100C comprises a continuum unit 1110C and a pulse compression unit 1112C. The continuum unit 1110C is configured to receive the pulse laser radiation beam L2" emitted by the pulse compression unit 1112A, and configured to emit the pulse laser radiation beam L21. The bandwidth of the pulse laser radiation beam L21 is larger than the bandwidth (2" of the pulse laser radiation beam L2", and the pulse duration of the pulse laser radiation beam L21 is smaller than the pulse duration t2" of the pulse laser radiation beam L2".

The foregoing descriptions regarding the implementations, connections, operations, and related advantages of other corresponding functional blocks in the EUV radiation light source generation apparatus 4000 are also applicable to the EUV radiation light source generation apparatus 6000. For the sake of brevity, those descriptions will not be repeated here.

As can be appreciated from the forgoing descriptions, the EUV radiation light source generation apparatuses in this disclosure feature the adjustments to the pulse laser radiation beam being inputted to the high-order harmonics generation unit 1300. By adjusting the center wavelength, the pulse waveform in time domain, and the pulse duration of the pulse laser radiation beam being inputted to the high-order harmonics generation unit 1300, the high-order harmonics generation unit 1300 is capable of emitting the pulse laser radiation beam reaching the specific electron volts.

For the EUV radiation light source generation apparatuses in this disclosure, the pulse laser radiation beam being inputted to the high-order harmonics generation unit 1300 may have the pulse duration, in time domain, at the picosecond level or at the femtosecond level.

For the EUV radiation light source generation apparatuses in this disclosure, the pulse laser radiation beam thereof reaching the specific electron volts may have the power at the nanowatt (nW) level to the watt (W) level.

Figure 7A:
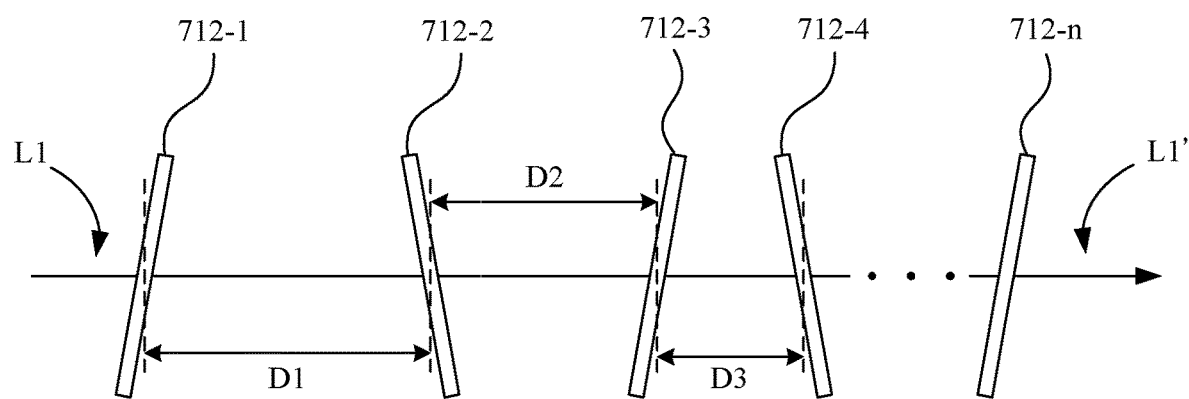
FIG. 7A is a schematic diagram of a continuum unit according to one embodiment of the present disclosure.
Figure 7B:
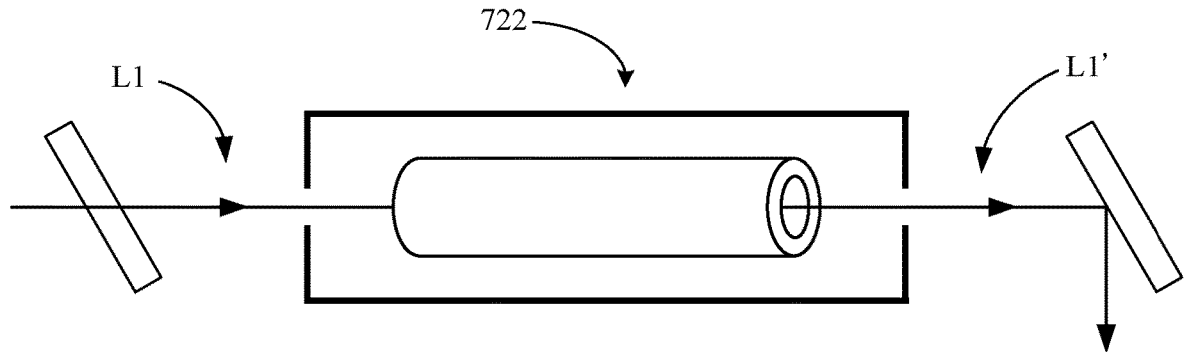
FIG. 7B is a schematic diagram of a continuum unit according to another embodiment of the present disclosure.
Figure 7C:
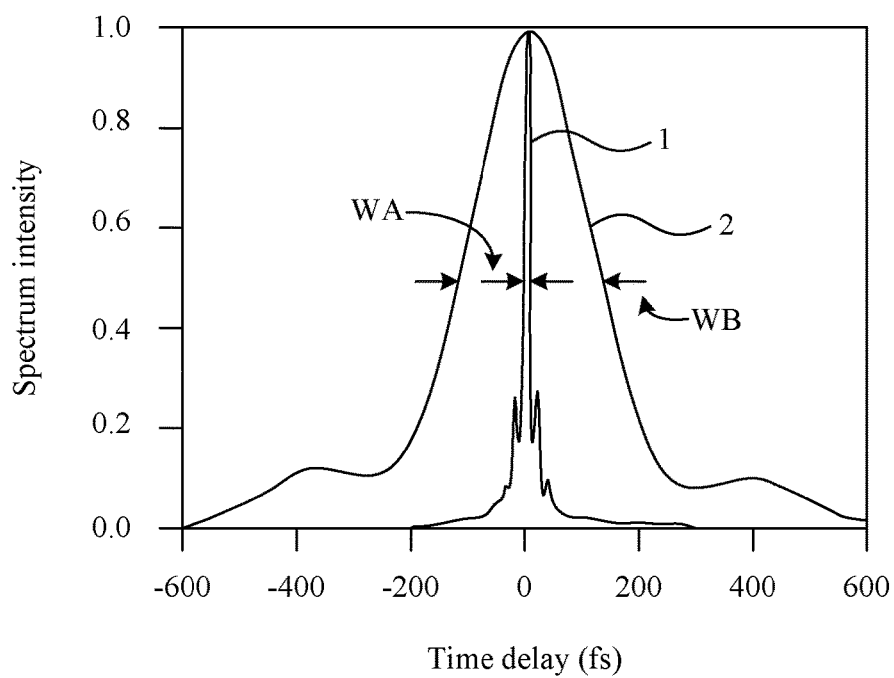
FIG. 7C is a schematic diagram of the pulse duration of the pulse laser radiation beam passed through the continuum unit.
Figure 7D:
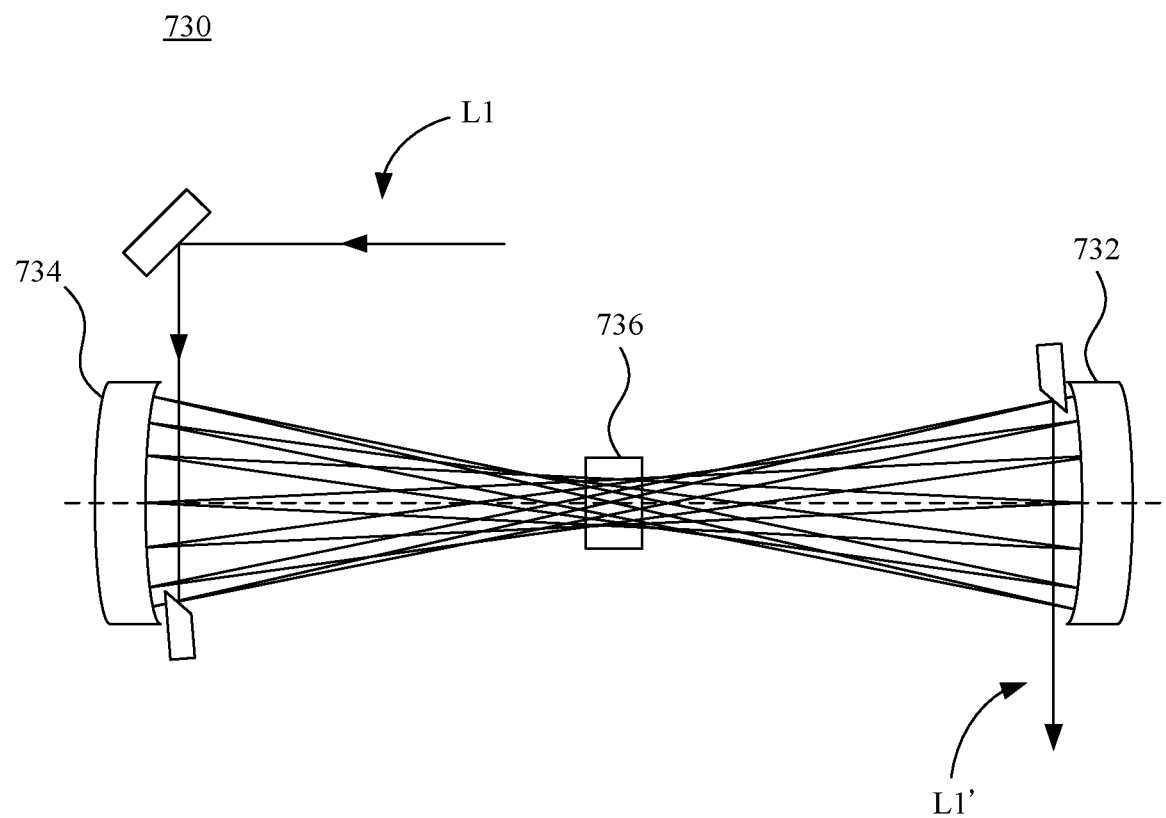
FIG. 7D is a schematic diagram of a continuum unit according to yet another embodiment of the present disclosure.

The following paragraphs provide specific implementations respectively for the components comprised by the EUV radiation light source generation apparatuses in this disclosure. FIG. 7A is a schematic diagram of a continuum unit 710 according to one embodiment of the present disclosure. FIG. 7B is a schematic diagram of a continuum unit 720 according to another embodiment of the present disclosure. FIG. 7C is a schematic diagram for illustrating the compressing ratio of the continuum unit of FIG. 7B. FIG. 7D is a schematic diagram of a continuum unit 730 according to yet another embodiment of the present disclosure. The continuum units 1110A, 1110B, and 1110C each can be realized by the continuum unit 710, 720, or 730. For ease of understanding, the following embodiments will be described respectively with reference to FIGS. 7A through 7D, and also to the continuum unit 1110A of FIG. 3 as an example.

Continuum units in this disclosure use the nonlinear effect of the pulse laser radiation beam passing through different mediums, preferably the third-order nonlinear effect, so that the spectrum of the pulse laser radiation beam is extended. Reference is first made to FIG. 7A, the continuum unit 710 comprises a plurality of condensed state transparent plates 712-1~712-n, and is configured to receive the corresponding pulse laser radiation beam L1, and is further configured to emit the corresponding pulse laser radiation beam L1'. The condensed state transparent plates 712-1~712-n are arranged in sequence on the light transmission path of the pulse laser radiation beam L1. An angle between the light transmission path and an incident surface of each of the condensed state transparent plates 712-1~712-n may be the Brewster's angle. The spacings, between every two central points of respective two adjacent condensed state transparent plates, are configured to decrease in sequence. For instance, the central point of the condensed state transparent plate 712-1 and the central point of the condensed state transparent plate 712-2 are spaced by a predetermined distance D1; the central point of the condensed state transparent plate 712-2 and the central point of the condensed state transparent plate 712-3 are spaced by a predetermined distance D2; the central point of the condensed state transparent plate 712-3 and the central point of the condensed state transparent plate 712-4 are spaced by a predetermined distance D3, in the event that the predetermined distance D1 is greater than the predetermined distance D2 and the predetermined distance D2 is larger than the predetermined distance D3, and so on.

The continuum unit 710 causes a widened bandwidth because of a plurality of times of third-order nonlinear effect induced by the condensed state transparent plates 712-1~712-n, but the bandwidth, the continuum unit 710 may extend, gradually becomes saturated when the number of the condensed state transparent plates 712-1~712-n increases. This is because of the material characteristics of the condensed state transparent plates 712-1~712-n, and also because of the pulse laser radiation beam L1 gradually diverged with the increasement of the number of the condensed state transparent plates 712-1~712-n. Therefore, to configure the continuum unit 710 for providing the maximum bandwidth in the most efficiency means, the condensed state transparent plates 712-1~712-n may be adjusted in number, relative positions, and/or thickness as will be apparent to those of ordinary skill in the art in view of the teachings herein.

The thickness of the aforesaid condensed state transparent plate relates to the self-focusing characteristic thereof, since the intensity gradient of the pulse laser radiation beam, in the cross-section view, is spatially distributed. The pulse laser radiation beam is focused when passing through the condensed state transparent plate, and is diverged, after self focusing on the light transmission path, when passing through air. Therefore, the pulse laser radiation beam repeatedly self focuses and diverges according to the condensed state transparent plate through which the pulse laser radiation beam passes. Therefore, the thickness of the condensed state transparent plate may be determined in accordance with the intensity of the pulse laser radiation beam and the characteristics of the condensed state transparent plate. In one embodiment, the focal spot of the self-focusing effect of the condensed state transparent plate is external to the condensed state transparent plate.

In another embodiment, the continuum unit 710 comprises a plurality of condensed state transparent plates each having the anti-reflection film (not shown). The plurality of condensed state transparent plates having the anti-reflection film are arranged in sequence on the light transmission path of the pulse laser radiation beam L1, and the incident surfaces of the condensed state transparent plates may be in parallel to each other.

Reference is made to FIGS. 7B and 7C, the continuum unit 720 comprises a hollow core fiber 722 so as to extend spectrum by using the third-order nonlinear effect of the pulse laser radiation beam passing through the inert gas in the hollow core fiber 722. The nonlinear effect induced by the gaseous medium relates to the length of a hollow core fiber. In general, a hollow core fiber of a longer length induces a higher nonlinear phase shift of the accumulated third-order nonlinear effect, thereby obtaining a more significant extended spectrum effect. FIG. 7C is a schematic diagram of the pulse duration of the pulse laser radiation beam passed through the continuum unit 720. Curve 1 represents the pulse laser radiation beam L1, which has not yet passed through the continuum unit 720, having a pulse duration WA of approximately 185 fs. Curve 2 represents the pulse laser radiation beam L1', which passed through the continuum unit 720, having a pulse duration WB of approximately 9 fs. Therefore, the compressing ratio of the hollow core fiber 722 is substantially 1:20 to 1:100 in this embodiment.

Reference is made to FIG. 7D, the continuum unit 730 may be realized by a multipass cell, wherein the multipass cell comprising a reflective mirror 732, a reflective mirror 734, and a medium 736 having nonlinear effect. The continuum unit 730 is configured to extend spectrum by using the third-order nonlinear effect caused by the pulse laser radiation beam passing through the medium 736 in the continuum unit 730 for multiple times. Notably, the pulse laser radiation beam L1 is a pulse laser radiation beam that has not yet passed through the continuum unit 730, while the pulse laser radiation beam L1' is a pulse laser radiation beam that passed through the continuum unit 730.

Other materials, such as the photonic crystal fiber, the high nonlinear fiber, and the bulk crystal like sapphire, can also be used to extend spectrum, the extended spectrum material of the continuum unit can be decided according to the energy of the received pulse laser radiation beam and also to the width of the spectrum to be extended, and this disclosure is not limited to the above materials. Other embodiments of the invention which generates the high power EUV light source by the selection of the wavelength of the pump laser and by the usage the continuum unit will be apparent to those of ordinary skill in the art in view of the teachings herein.

Figure 8A:
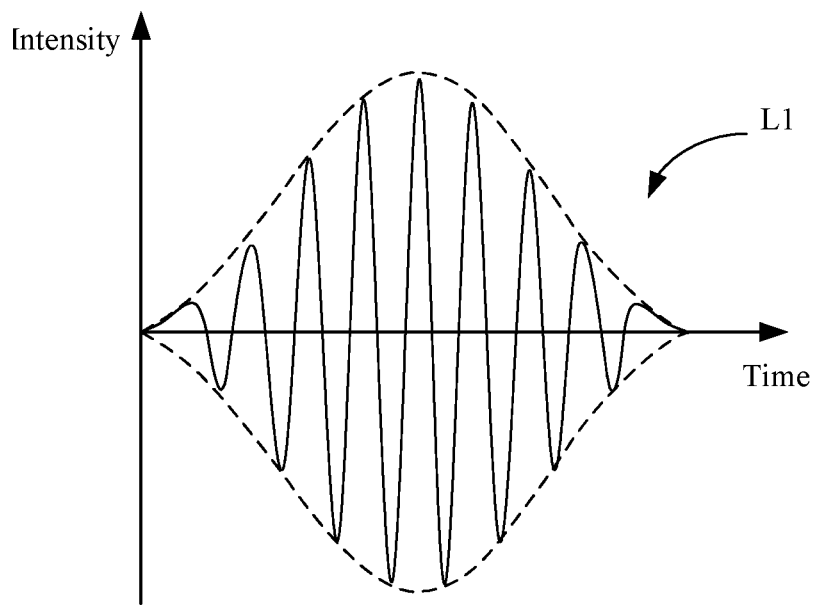
FIG. 8A is a simplified waveform schematic of the pulse laser radiation beam inputted to the continuum unit according to one embodiment of the present disclosure.
Figure 8B:
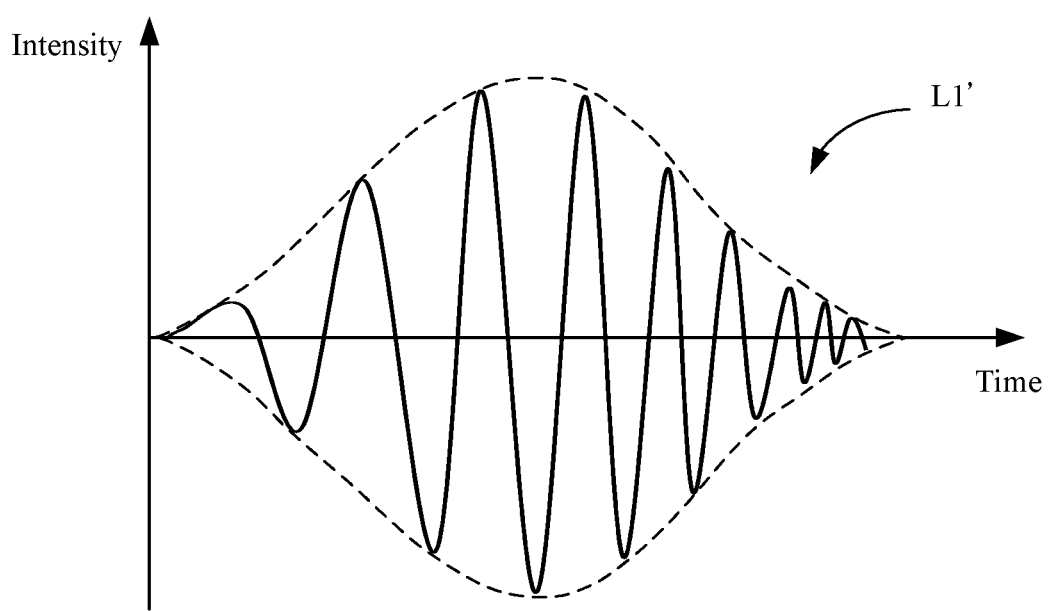
FIG. 8B is a simplified waveform schematic diagram of the pulse laser radiation beam emitted by the continuum unit according to one embodiment of the present disclosure.

FIG. 8A is a simplified waveform schematic of the pulse laser radiation beam L1 inputted to the continuum unit 710 according to one embodiment of the present disclosure. FIG. 8B is a simplified waveform schematic diagram of the pulse laser radiation beam L1' emitted by the continuum unit 710 according to one embodiment of the present disclosure. Reference is first made to FIG. 8A, the envelope of the pulse laser radiation beam L1 inputted to the continuum unit 710 is indicated by dotted lines, while the carrier signal of the pulse laser radiation beam L1 is indicated by a solid line. Reference is made to FIG. 8B, the envelope of the pulse laser radiation beam L1' is indicated by dotted lines, while the carrier signal of the pulse laser radiation beam L1' is indicated by a solid line.

As can be appreciated from FIGS. 8A and 8B, the carrier frequencies of the pulse laser radiation beam L1 and the pulse laser radiation beam L1' is substantially equal, but difference frequency components of the pulse laser radiation beam L1 are in phase in the frequency domain. As shown in FIG. 8B, the pulse laser radiation beam L1' passed through the continuum unit 710 has a widened bandwidth, and there are phase difference between the higher-frequency components and the lower-frequency components of the pulse laser radiation beam L1'.

Reference is made to FIG. 3, to eliminate the spectral phase difference, the pulse laser radiation beam L1' is further inputted to the pulse compression unit 1112A so that different frequency components of the pulse laser radiation beam L1' is adjusted, by phase compensation, to be substantially in phase. As a result, owing to constructive interference of different frequency components, the pulse laser radiation beam L1" emitted by the pulse compression unit 1112A has the time domain pulse duration more narrow than that of the pulse laser radiation beam L1 and the pulse laser radiation beam L1'.

In one embodiment, a ratio of the pulse duration of the pulse laser radiation beam L1 to that of the pulse laser radiation beam L1" may be up to 10, but this disclosure is not limited thereto. The ratio of the pulse duration of the pulse laser radiation beam L1 to that of the pulse laser radiation beam L1" may be adjusted according to practical design requirements.

Additionally, reference is made to FIG. 5, since the EUV radiation light source generation apparatus 5000 comprises two continuum units 1110A~1110B and two pulse compression units 1112A~1112B, the ratio of the pulse duration of the pulse laser radiation beam L1 to that of the pulse laser radiation beam L2" may be up to 100 in the EUV radiation light source generation apparatus 5000. In one embodiment, the ratio of the pulse duration of the pulse laser radiation beam L1 to that of the pulse laser radiation beam L2" is in a range of 1:20 to 1:1000.

In one embodiment, for example, the center wavelength $\lambda 1$, the bandwidth $\beta 1$, and the pulse duration t1 of the pulse laser radiation beam L1 of the EUV radiation light source generation apparatus 5000 may be substantially 1030 nm, 6 nm, and 200 fs, respectively. The pulse duration t2" of the pulse laser radiation beam L2" may be substantially equal to or lower than 10 fs.

Figure 9A:
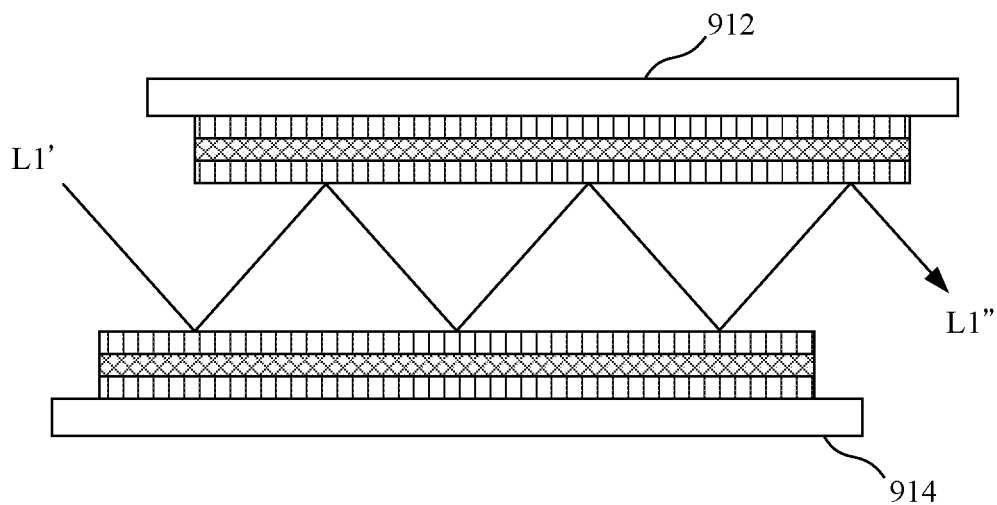
FIG. 9A is a schematic diagram of a pulse compression unit according to one embodiment of the present disclosure.

FIG. 9A is a schematic diagram of a pulse compression unit 910 according to one embodiment of the present disclosure. The pulse compression unit 910 may be used to realize the pulse compression units 1112A, 1112B, and 1112C in the aforementioned embodiments, and comprises chirped mirrors 912 and 914 arranged substantially in parallel to each other. Each of the chirped mirrors 912 and 914 may be realized by comprising a plurality of coating layers. For the purpose of explanation convenience, only two chirped mirrors are shown in FIG. 9A, but this disclosure is not limited thereto. In some embodiments, the number of the chirped mirrors may be decided according to the practical design requirements.

For ease of understanding, FIG. 9A will be explained with the pulse compression unit 1112A of FIG. 3. As shown in FIG. 9A, the pulse compression unit 910 is configured to receive the corresponding pulse laser radiation beam L1'. The pulse laser radiation beam L1' comprises difference frequency components that are not in phase, and each coating layer of the chirped mirrors 912 and 914 is configured to reflect a corresponding one of the difference frequency components. The difference frequency components will be rendered substantially in phase after being reflected for multiple times. In other words, the pulse laser radiation beam L1" emitted by the pulse compression unit 910 comprises difference frequency components that are substantially in phase.

Figure 9B:
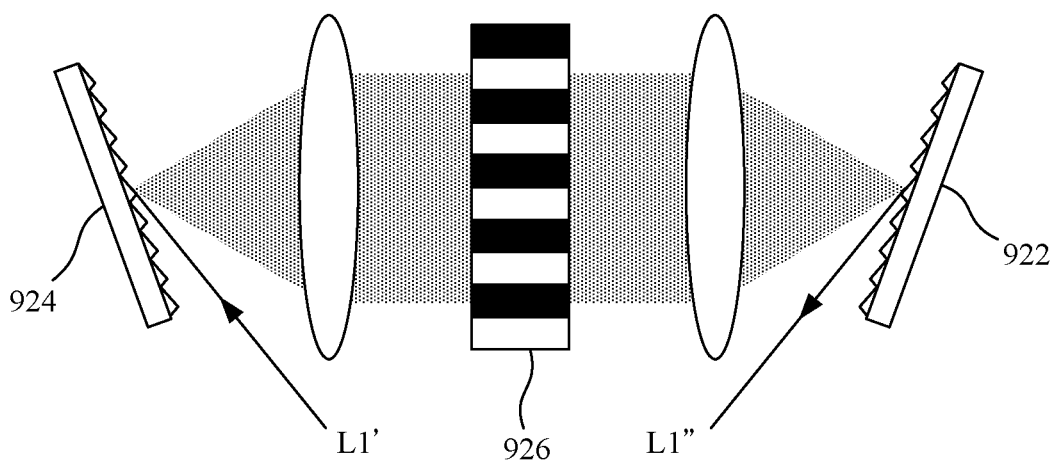
FIG. 9B is a schematic diagram of a pulse compression unit according to another embodiment of the present disclosure.

FIG. 9B is a schematic diagram of a pulse compression unit 920 according to one embodiment of the present disclosure. The pulse compression unit 920 comprises a diffraction unit 922, a diffraction unit 924, and a liquid crystal pixel matrix 926. For the purpose of explanation convenience, only two diffraction units 922 and 924 are shown in FIG. 9B, but this disclosure is not limited thereto. In some embodiment, the number of the diffraction unit may be decided according to the practical design requirements. In one embodiment, the diffraction unit may be realized by the grating.

For ease of understanding, FIG. 9B will be explained with the pulse compression unit 1112A of FIG. 3. As shown in FIG. 9B, when the pulse compression unit 920 receives the pulse laser radiation beam L1', the diffraction unit 922 and the diffraction unit 924 are configured to adjust the light transmission path of the pulse laser radiation beam L1' so that the pulse laser radiation beam L1' is incident into the liquid crystal pixel matrix 926. The liquid crystal pixel matrix 926 may control the twist angle of the liquid crystal for different sections independently. As a result, different frequency components that have passed the liquid crystal pixel matrix 926 have phases unrelated to frequencies so that the spatial light modulation is achieved.

In some embodiments, the pulse compression unit may also be realized by a combination of the grating pair and other optical elements (e.g., the lens or the reflective mirror), but this disclosure is not limited thereto. It should be understood that any other suitable means of pulse duration compression technology for the pulse laser radiation beam may be used as will be apparent to those of ordinary skill in the art in view of the teachings herein.

In another embodiment, the pulse compression unit not only adjusts, by phase compensation, the amplitude of the pulse laser radiation beam in time domain, but also adjusts other characteristics of the pulse laser radiation beam. Reference is again made to FIG. 9B, for example, the liquid crystal pixel matrix 926 may adjust the luminance of the pulse laser radiation beam in time domain by control the twist angle of the liquid crystal for different sections independently in time. As a result, the time light modulation is achieved.

In addition, the pulse compression unit adjusts characteristics in a wider degree when the bandwidth of the inputted pulse laser radiation beam increases. Therefore, in some embodiments, the continuum unit is arranged in front of the pulse compression unit so that the pulse compression unit receives a pulse laser radiation beam of a bandwidth as wide as possible.

Reference is made again to FIG. 4, the wavelength conversion unit 1200 in this disclosure may comprise a nonlinear optical crystals which is configured to convert the center wavelength $\lambda 1$ of the pulse laser radiation beam L1, thereby emitting a pulse laser radiation beam L2 having the center wavelength $\lambda 2$ and the bandwidth $\beta 2$, wherein the center wavelength $\lambda 1$ may be different from the center wavelength $\lambda 2$. In one embodiment, the wavelength conversion unit 1200 is realized by the frequency-doubling crystal. Therefore, the wavelength $\lambda 2$ is n times of the wavelength $\lambda 1$, and n is an integer.

The acceptance bandwidth of the wavelength conversion unit 1200 may be a sine square function. Therefore, the maximum input bandwidth of the wavelength conversion unit 1200 is related to the acceptance bandwidth thereof. If the pulse laser radiation beam incident into the wavelength conversion unit 1200 having a bandwidth wider than the acceptance bandwidth of the wavelength conversion unit 1200, the converting efficiency of the wavelength conversion unit 1200 may decrease. Therefore, as shown in FIGS. 4 and 6, the wavelength conversion unit 1200 may be arranged between the pump laser 1002 and the continuum unit 1110A so that the wavelength conversion unit 1200 has an improved converting efficiency.

In addition, reference is made to FIG. 5, the wavelength conversion unit 1200 is arranged between the continuum unit 1110A and the continuum unit 1110B, in order to prevent the wavelength conversion unit 1200 from receiving a pulse laser radiation beam having an excessively wide bandwidth caused by twice spectrum extending operation. As a result, not only the adjustability of the pulse laser radiation beam LHHG is increased but also the converting efficiency of the wavelength conversion unit 1200 is ensured.

The aforementioned non-linear optical crystal may comprise materials configured to realize nonlinear optical processes, for example, the second-harmonics generation (SHG), the third-harmonics generation (THG), the optical parametric oscillator (OPO), the optical parametric amplification (OPA), the self-phase modulation (SPM), the optical parametric chirped-pulse amplification (OPCPA), the sum-frequency generation (SFG), the difference-frequency generation (DFG), etc. It should be understood that any other suitable means of frequency conversion for the pulse laser radiation beam may be used as will be apparent to those of ordinary skill in the art in view of the teachings herein.

Figure 10A:
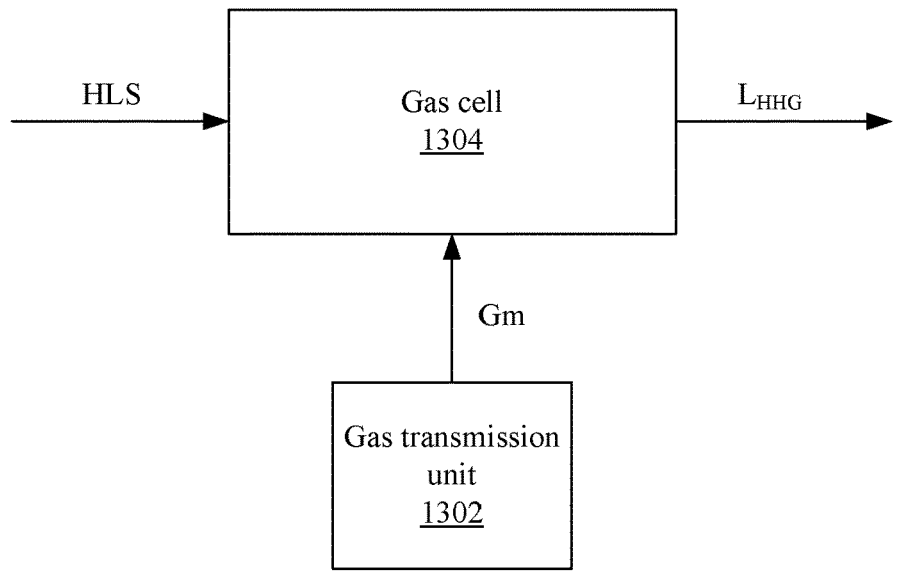
FIG. 10A is a simplified functional block diagram of a high-order harmonics generation unit of FIG. 2 according to one embodiment of the present disclosure.
Figure 10B:
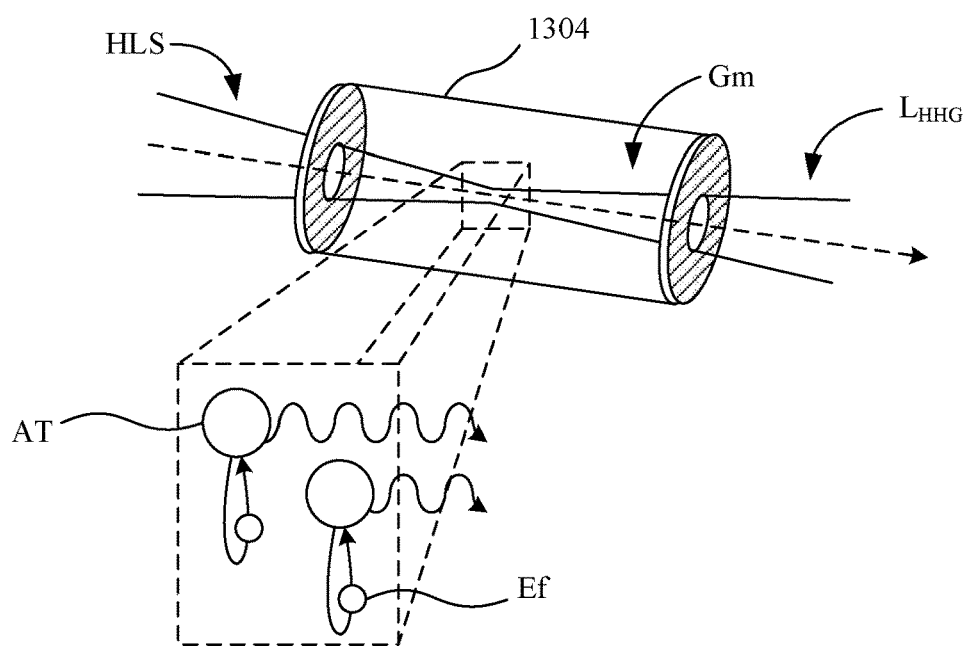
FIG. 10B is a schematic diagram for illustrating electron behavior of the high-order harmonics generation unit according to one embodiment of the present disclosure.

FIG. 10A is a simplified functional block diagram of a high-order harmonics generation unit 1300 of FIG. 2 according to one embodiment of the present disclosure. FIG. 10B is a schematic diagram for illustrating electron behavior of the high-order harmonics generation unit 1300 according to one embodiment of the present disclosure. As shown in FIG. 10A, the high-order harmonics generation unit 1300 comprises a gas transmission unit 1302 and a gas cell 1304, and is configured to receive the high order harmonic generation source HLS. The high order harmonic generation source HLS may be the pulse laser radiation beam received by the high-order harmonics generation unit 1300, such as the pulse laser radiation beam L2 of FIG. 3, the pulse laser radiation beam L2" of FIG. 4, the pulse laser radiation beam L2" of FIG. 5, and the pulse laser radiation beam L21' of FIG. 6.

The gas transmission unit 1302 is configured to provide the high order harmonic generation medium Gm to the gas cell 1304. The high-order harmonics generation unit 1300 focuses the high order harmonic generation source HLS to the high order harmonic generation medium Gm in the gas cell 1304. In some embodiments, the high order harmonic generation medium Gm may be realized by the inert gas such as helium (He), neon (Ne), argon (Ar), krypton (Kr), or xenon (Xe). In some embodiments, in the situation that the pulse duration of the high order harmonic generation source HLS is approximately 10 to 20 fs, when the high order harmonic generation source HLS has a center wavelength of 1030 nm, one of ordinary skill in the art may select argon with air pressure adjustment to obtain the pulse laser radiation beam LHHG having preferable intensity and a center wavelength of 13.5 nm. In some embodiments, when the high order harmonic generation source HLS has a center wavelength of 515 nm, one of ordinary skill in the art may select helium with air pressure adjustment to obtain the pulse laser radiation beam LHHG having preferable intensity and a center wavelength of 13.5 nm, but this disclosure is not limited thereto. In some embodiments, type of gas, gas pressure, center wavelength, pulse duration, and location of focal point may be adjusted according to practical requirements.

Reference is made to FIG. 10B, the high order harmonic generation source HLS focused to the high order harmonic generation medium Gm renders the bound electros of the high order harmonic generation medium Gm, which are at the ground state, to be ionized and therefore becomes free electrons Ef. The free electrons gain kinetic energy because of being accelerated during the ionization process. As the electronic field of the high order harmonic generation source HLS being reversed, part of the free electrons Ef recombine with the atoms AT of the high order harmonic generation medium Gm during the process of backing to ground state. Therefore, the pulse laser radiation beam LHHG having a specific center wavelength (i.e., reaching specific electron volts) is emitted.

In one embodiment, the pulse laser radiation beam LHHG emitted by the high-order harmonics generation unit 1300 reaches electron volts substantially equal to 92 eV and has the center wavelength of 13.5 nm.

In another embodiment, the pulse laser radiation beam LHHG emitted by the high-order harmonics generation unit 1300 reaches electron volts substantially equal to 26 eV and has the center wavelength of 47 nm.

In some embodiments, the pulse laser radiation beam LHHG emitted by the high-order harmonics generation unit 1300 is of the spectrum in a range of EUV light and soft x-ray, and the pulse laser radiation beam LHHG is absorbable to the atmosphere environment. Therefore, the high-order harmonics generation unit 1300 needs to be operated in a vacuum environment.

Figure 11A:
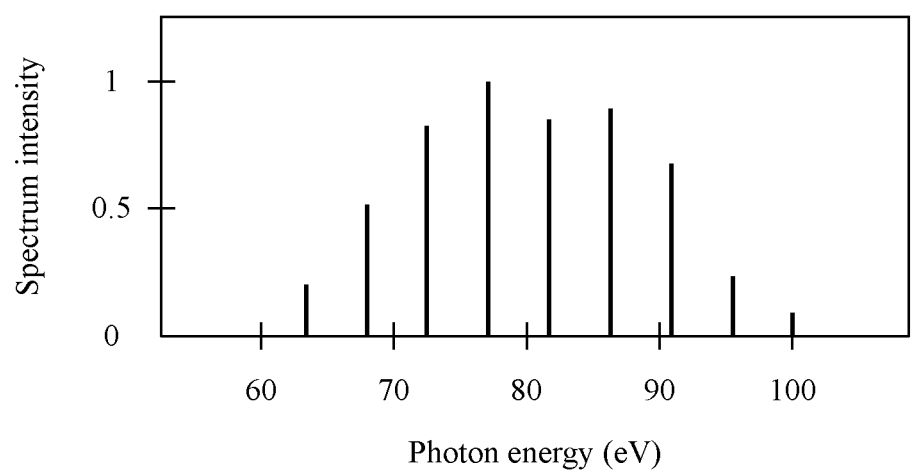
FIG. 11A is a schematic diagram of the emission spectrum of the pulse laser radiation beam emitted by the high-order harmonics generation unit according to one embodiment of the present disclosure.

FIG. 11A is a schematic diagram of the emission spectrum of the pulse laser radiation beam LHHG emitted by the high-order harmonics generation unit 1300 according to one embodiment of the present disclosure. As shown in FIG. 11A, the emission spectrum comprises a plurality of pulse laser radiation beams having energy of different harmonic orders, wherein the X-axis is the electron volt (i.e., the photon energy) and the Y-axis is the normalized spectral intensity. The spectral line width of energy of each harmonic order becomes wider when the electron volt increases; the distance of energy between harmonic orders is also slightly increases when the electron volt increases. A larger electron volt corresponds to a shorter wavelength, for example, 92 eV corresponds to 13.5 nm wavelength. Notably, since the cut-off wavelength of the pulse laser radiation beam LHHG (i.e., the wavelength corresponding to the energy of the highest harmonic order) may be correlated to the center wavelength of the pulse laser radiation beam inputted to the high-order harmonics generation unit 1300. As a result, an expected cut-off wavelength may be obtained by adjusting the center wavelength and the pulse duration of the pulse laser radiation beam inputted to the high-order harmonics generation unit 1300.

In specific, the larger the center wavelength of the pulse laser radiation beam and the smaller the pulse duration of the pulse laser radiation beam inputted to the high-order harmonics generation unit 1300, the larger the cut-off energy of the pulse laser radiation beam LHHG, and the smaller the cut-off wavelength of the pulse laser radiation beam LHHG.

Figure 11B:
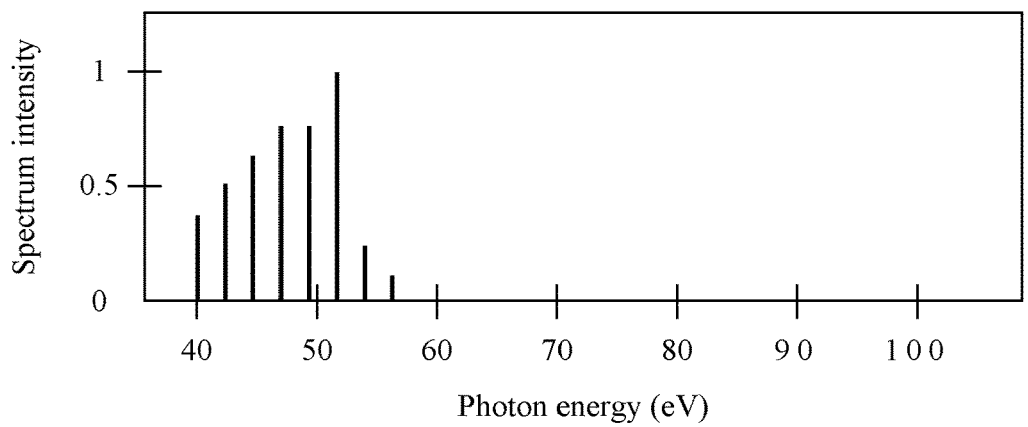
FIG. 11B is a schematic diagram of the emission spectrum generated by using the high-order harmonics generation unit to process the pulse laser radiation beam having un-adjusted wavelength and un-adjusted pulse duration.
Figure 11C:
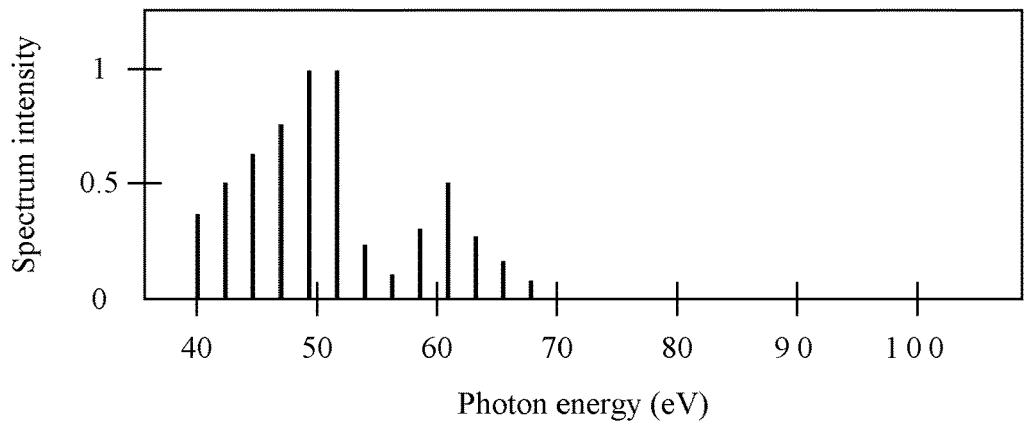
FIG. 11C is a schematic diagram of the emission spectrum generated by using the high-order harmonics generation unit to process the pulse laser radiation beam having adjusted pulse duration.
Figure 11D:
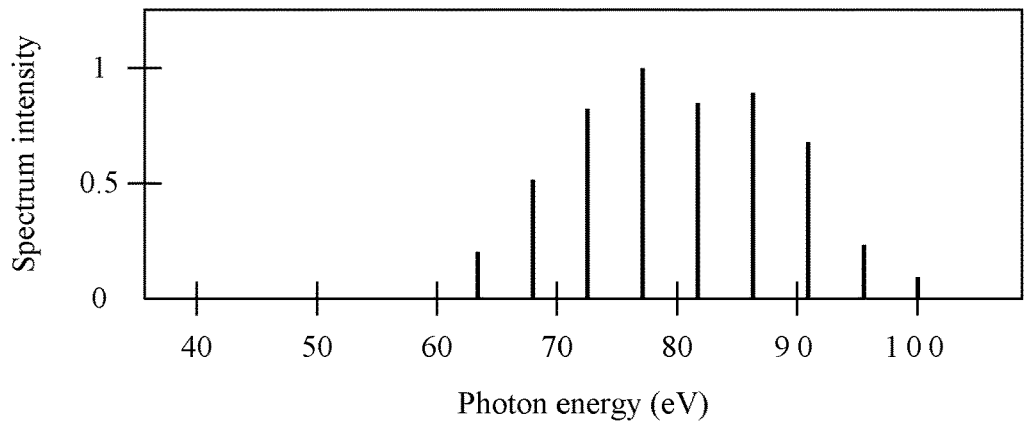
FIG. 11D is a schematic diagram of the emission spectrum generated by using the high-order harmonics generation unit to process the pulse laser radiation beam having adjusted wavelength and adjusted pulse duration.

For example, FIG. 11B is a schematic diagram of the emission spectrum generated by using the high-order harmonics generation unit 1300 to process the pulse laser radiation beam having un-adjusted wavelength and un-adjusted pulse duration. FIG. 11C is a schematic diagram of the emission spectrum generated by using the high-order harmonics generation unit 1300 to process the pulse laser radiation beam having adjusted pulse duration. FIG. 11D is a schematic diagram of the emission spectrum generated by using the high-order harmonics generation unit 1300 to process the pulse laser radiation beam having adjusted wavelength and adjusted pulse duration. Take FIG. 11B as an example, the harmonic order energies thereof are mostly smaller than 55 eV, and thereof the corresponding wavelength thereof is approximately longer than 22.5 nm. Take FIG. 11C as another example, the different harmonic order energies are mostly smaller than 68 eV, that is, the corresponding wavelength thereof is approximately longer than 18 nm. Take FIG. 11D as yet another example, the different harmonic order energies are mostly in a range of 65 to 100 eV, that is, the corresponding wavelength thereof is in a range of approximately 13 to 18 nm.

In other words, by applying spectrum extending and center wavelength adjustment to the pulse laser radiation beam inputted to the high-order harmonics generation unit 1300, the emission spectrum of the high-order harmonics generation unit 1300 is moved to a region corresponding to shorter wavelength. As a result, the spectral intensity of a high-order harmonic pulse laser radiation beam, which reaches a specific electron volt, may be adjusted according to practical requirements. In general, it is preferable that the spectral intensity of the pulse laser radiation beam emitted by the high-order harmonics generation unit 1300, which reaches the specific electron volt, to be greater. In one embodiment, the pulse laser radiation beam reaching the specific electron volt may be configured to be in phase by controlling the ratio of the ground state atoms to the excited state ions of the high order harmonic generation medium. As a result, the spectral intensity of the pulse laser radiation beam reaching the specific electron volt increases because of the constructive interference.

In another embodiment, the gas transmission unit 1302 of FIG. 10A is configured to control the air pressure of the high order harmonic generation medium Gm, that is, the gas transmission unit 1302 may adjust the concentration of the gas configured to be the high order harmonic generation medium Gm. As a result, the pulse laser radiation beam reaching the specific electron volt is in phase to induce constructive interference, thereby increasing spectral intensity, but this disclosure is not limited thereto. It should be understood that any other suitable means of phase matching technology may be used as will be apparent to those of ordinary skill in the art in view of the teachings herein.

In another embodiment, the EUV radiation light source generation apparatus further comprises a band pass filter. The band pass filter is configured to pass the pulse laser radiation beam having a specific level of energy, but filter the pulse laser radiation beam having other levels of electron energy, but this disclosure is not limited thereto. It should be understood that any other suitable means of optical filtering technology may be used as will be apparent to those of ordinary skill in the art in view of the teachings herein.

Figure 12:
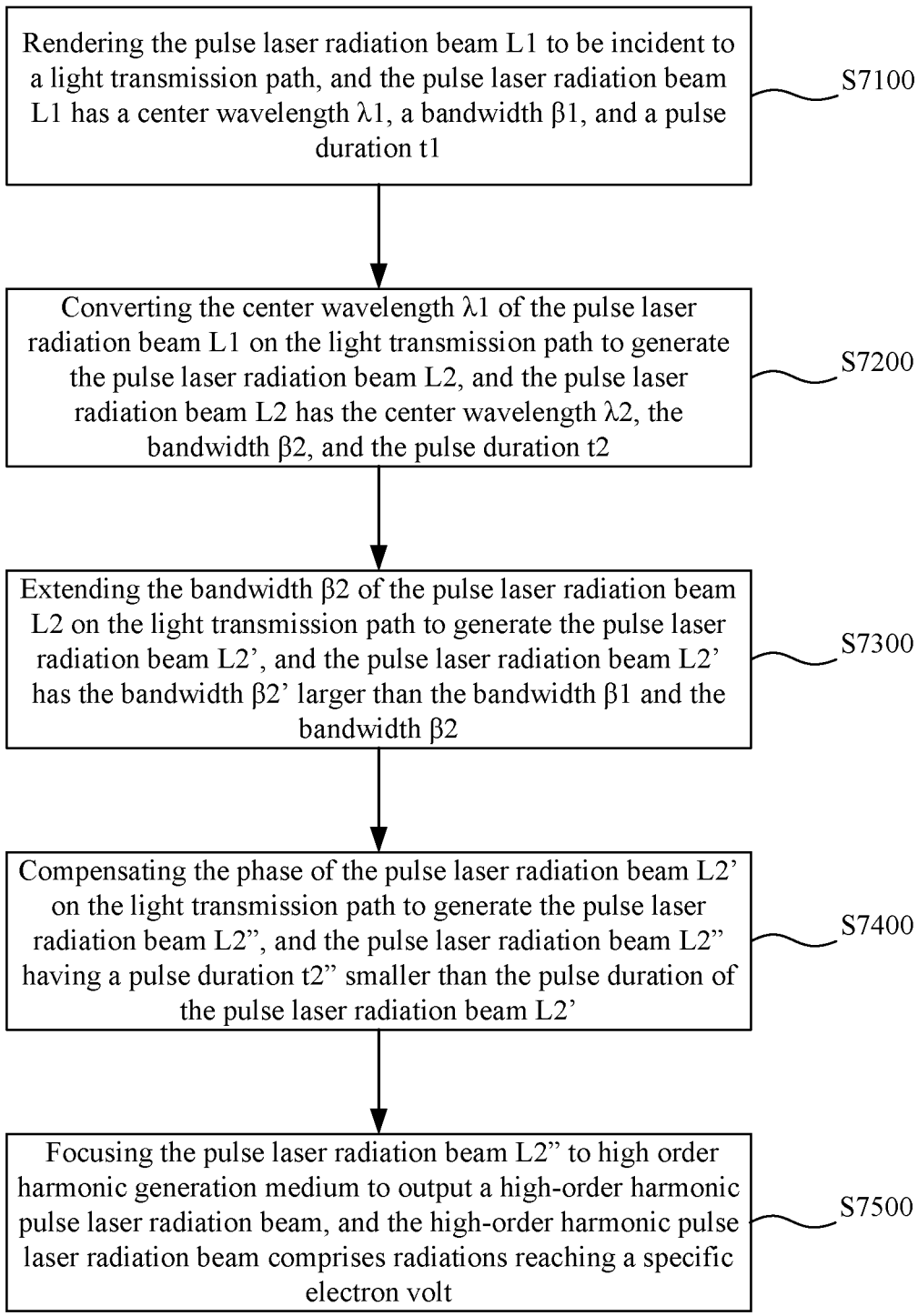
FIG. 12 is a flowchart of an EUV radiation light source generating method according to one embodiment of the present disclosure.

FIG. 12 is a flowchart of an EUV radiation light source generating method 7000 according to one embodiment of the present disclosure. The EUV radiation light source generating method 7000 comprises the following operations:

Operation S7100: rendering the pulse laser radiation beam L1 to be incident to a light transmission path, wherein the pulse laser radiation beam L1 has a center wavelength $\lambda 1$, a bandwidth $\beta 1$, and a pulse duration t1;

Operating S7200: converting the center wavelength $\lambda 1$ of the pulse laser radiation beam L1 on the light transmission path to generate the pulse laser radiation beam L2, wherein the pulse laser radiation beam L2 has the center wavelength λ2, the bandwidth β2, and the pulse duration t2;

Operation S7300: extending the bandwidth β2 of the pulse laser radiation beam L2 on the light transmission path to generate the pulse laser radiation beam L2', wherein the pulse laser radiation beam L2' has the bandwidth β2'. The spectrum of the pulse laser radiation beam L2' is the supercontinuum spectrum, and the bandwidth β2' is larger than the bandwidth β1 and the bandwidth β2;

Operation S7400: compensating the phase of the pulse laser radiation beam L2' on the light transmission path to generate the pulse laser radiation beam L2", wherein the pulse laser radiation beam L2" having a pulse duration t2" smaller than the pulse duration of the pulse laser radiation beam L2';

Operation S7500: focusing the pulse laser radiation beam L2" to high order harmonic generation medium Gm to emit a high-order harmonic pulse laser radiation beam LHHG, wherein the high-order harmonic pulse laser radiation beam comprises radiations reaching a specific electron volt (e.g., 92 eV).

Figure 13:
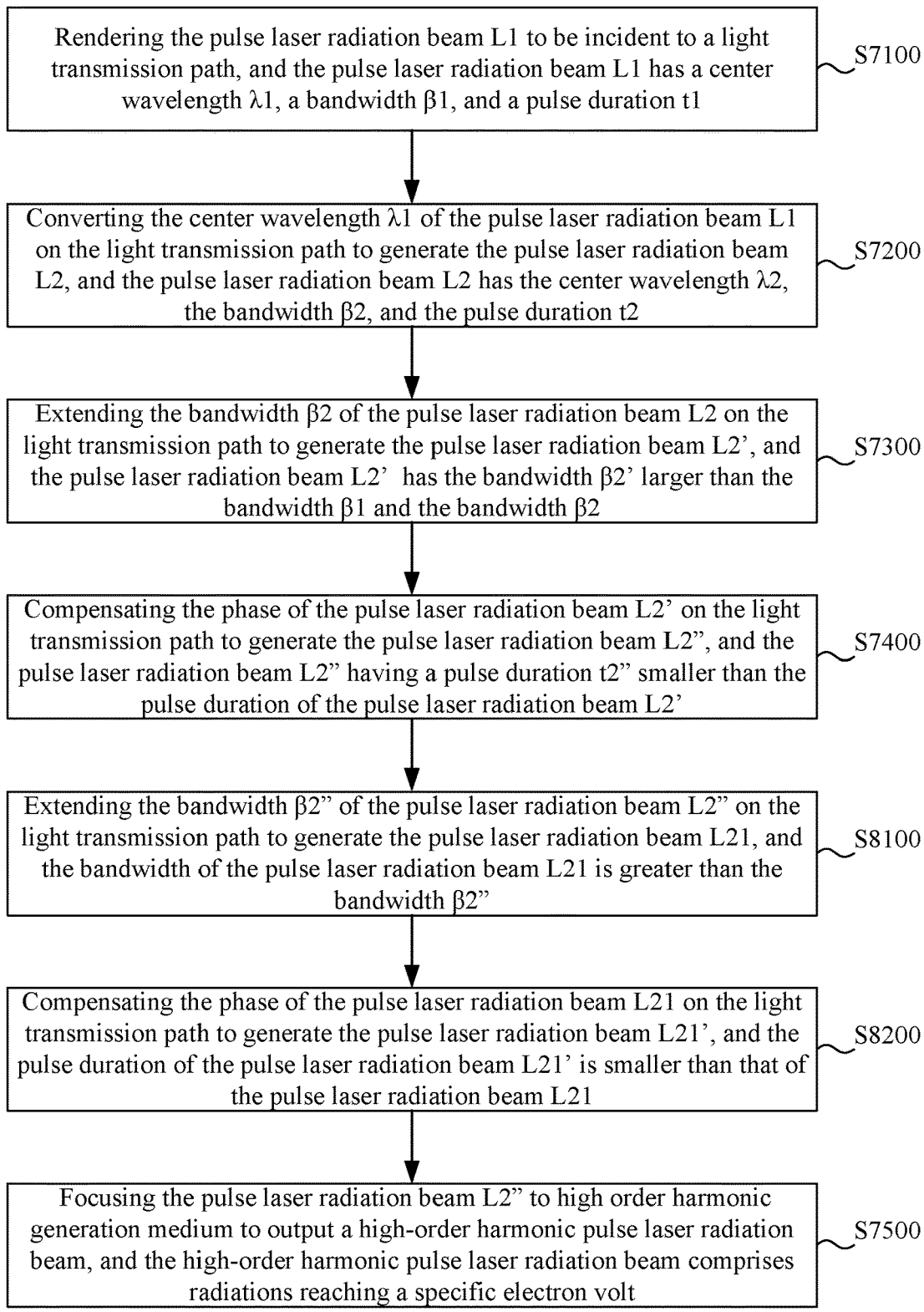
FIG. 13 is a flowchart of an EUV radiation light source generating method according to another embodiment of the present disclosure.

FIG. 13 is a flowchart of an EUV radiation light source generating method 8000 according to one embodiment of the present disclosure. The EUV radiation light source generating method 8000 is similar to the EUV radiation light source generating method 7000 of FIG. 12, the different is that the EUV radiation light source generating method 8000 further comprises the following operations:

Operation S8100: after operation S7400, extending the bandwidth β2" of the pulse laser radiation beam L2" on the light transmission path to generate the pulse laser radiation beam L21, wherein the bandwidth of the pulse laser radiation beam L21 is greater than the bandwidth β2" of the pulse laser radiation beam L2";

Operation S8200: compensating the phase of the pulse laser radiation beam L21 on the light transmission path to generate the pulse laser radiation beam L21', wherein the pulse duration of the pulse laser radiation beam L21' is smaller than that of the pulse laser radiation beam L21, and the aforesaid operation S7500 may be executed when operation S8200 of the EUV radiation light source generating method 8000 is finished;

In the EUV radiation light source generating methods 7000 and 8000 of some embodiments, after operation S7100 is finished, operations S7300 and S7400 may be executed successfully before operation S7200.

Figure 14:
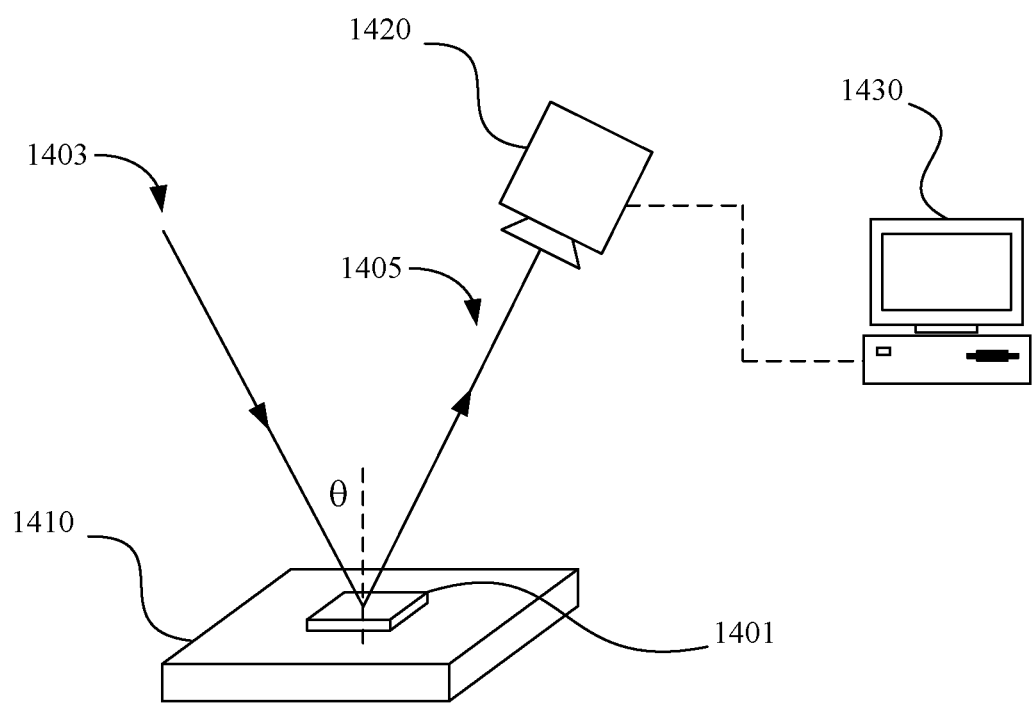
FIG. 14 is a schematic diagram of a defect detection apparatus according to one embodiment of the present disclosure.

FIG. 14 is a schematic diagram of a defect detection apparatus 1400 according to one embodiment of the present disclosure. The defect detection apparatus 1400 of FIG. 14 may be used to realize the defect detection apparatus 2100 of FIG. 2. The defect detection apparatus 1400 comprises a testing platform 1410, a detection unit 1420, and an analysis unit 1430. The testing platform 1410 is configured to set a sample under test 1401. In some embodiments, the sample under test 1401 may be the mask blank, the patterned mask, or the exposed patterned substrate (e.g., a wafer), but this disclosure is not limited thereto. It should be understood that any other types of sample under test suitable for at— wavelength optical metrology using EUV pulse laser radiation beam may be used as will be apparent to those of ordinary skill in the art in view of the teachings herein. In addition, the detection unit 1420 may be realized by the charge-coupled device (CCD) or a CMOS based sensor.

The defect detection apparatus 1400 is configured to use a high order harmonic radiation beam 1403 having a specific electron volt. The high order harmonic radiation beam 1403 may be the pulse laser radiation beam LHHG emitted by the high-order harmonics generation unit 1300 in the aforesaid embodiments. In other words, the high order harmonic radiation beam 1403 is coherent light, and thus the defect detection apparatus 1400 is suitable for a defect detection method that is diffraction based and using coherent light.

The defect detection apparatus 1400 renders the high order harmonic radiation beam 1403 to be incident to the sample under test 1401 by a specific angle of incidence θ. In one embodiment, the angle of incidence θ may be substantially equal to an angle which is used during exposure, for example, 6 degrees, but this disclosure is not limited thereto. The high order harmonic radiation beam 1403 reflected by the sample under test 1401 forms a reflected radiation beam 1405 comprising information of the sample under test 1401. The detection unit 1420 is configured to gather the reflected radiation beam 1405 to obtain a diffraction result of the high order harmonic radiation beam 1403 diffracting the sample under test 1401. The detection unit 1420 is further configured to transmit the diffraction result to the analysis unit 1430 by wire or wireless transmission so that the analysis unit 1430 is configured to construct an image of the sample under test 1401 according to the diffraction result.

In this embodiment, no reflecting-type or transmission-type focusing optical unit is needed for the process which the reflected radiation beam 1405 is incident into the detection unit 1420. Therefore, the defect detection apparatus 1400 prevents the reflected radiation beam 1405 from power loss to improve the inspection accuracy and throughout, and the total system complexity is also decreased. The analysis unit 1430 may use the coherent diffraction imaging method to construct, according to the non-focused reflected radiation beam 1405, the image of the sample under test 1401.

Figure 15:
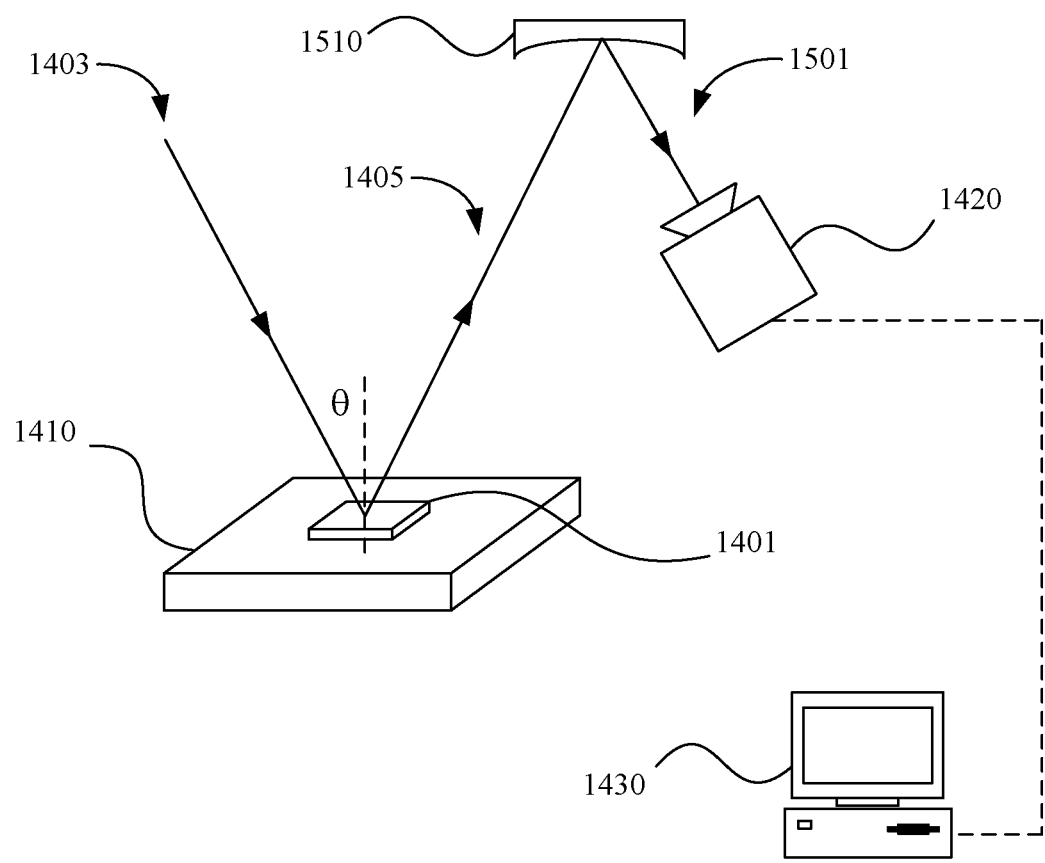
FIG. 15 is a schematic diagram of a defect detection apparatus according to another embodiment of the present disclosure.

FIG. 15 is a schematic diagram of a defect detection apparatus 1500 according to another embodiment of the present disclosure. The defect detection apparatus 1500 of FIG. 15 may be used to realize the defect detection apparatus 2100 of FIG. 2 and is similar to the defect detection apparatus 1400 of FIG. 14, the difference is that the defect detection apparatus 1500 of FIG. 15 further comprises a focusing optical unit 1510. The focusing optical unit 1510 is a reflecting-type or transmission-type optical element. The specific defect detection method is similar to or the same as the previous embodiment and those descriptions will not be repeated herein for the sake of brevity. Compared to the previous embodiment, the focusing optical unit 1510 in this embodiment is capable of focusing the light beams comprising the information of the sample under test 1401, thereby obtaining a more accurate analyzing result.

In specific, the reflected radiation beam 1405 that has been focused by the focusing optical unit 1510 forms the focused radiation beam 1501 comprising information of the sample under test 1401. The detection unit 1420 gathers the focused radiation beam 1501 to obtain the diffraction result of the high order harmonic radiation beam 1403 diffracting the sample under test 1401. The detection unit 1420 further transmits the diffracting result to the analysis unit 1430 by wire or wireless transmission so that the analysis unit 1430 is able to construct the image of the sample under test 1401 according to the diffraction result.

In this embodiment, the analysis unit 1430 may use simple image processing method to construct the image of the sample under test 1401, for example, comparing the obtained diffraction result with diffraction result data stored in the user's data base to accelerate defect detection. If the obtained diffraction result mismatches the diffraction result data, a further defect classification may be applied to a specific region of the sample under test 1401, in order to repair defects in the specific region of the sample under test 1401.

Since the EUV pulse laser radiation beam is absorbable to the atmosphere environment. Therefore, in some embodiments, the defect detection apparatuses 1400 and 1500 are implemented in the vacuum environment.

It should be understood that this invention is not limited to defect detection for mask, but is also suitable for defect detection for patterned wafer or non-patterned wafer, and further suitable for measurement of dose of photoresist and measurement of optical performance (e.g., transmittance and reflectance) of the mask pellicle.

As can be appreciate from the foregoing descriptions, this disclosure provides an EUV radiation light source generation apparatus, wherein the pulse laser radiation beam provided by the pump laser thereof passes at least one pulse shaping unit and the wavelength conversion unit in order to provide the high order harmonic generation source. The pulse laser radiation beam further passes the high-order harmonics generation unit to generate the high-order harmonic pulse laser radiation beam of the specific electron volt.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. An extreme-ultraviolet (EUV) radiation light source generation apparatus, comprising:
   a pump laser, configured to provide a pulse laser radiation beam;
   at least one pulse shaping unit, wherein each one of the at least one pulse shaping unit is configured to conduct a spectrum extending operation and a phase compensation operation to the pulse laser radiation beam, and the phase compensation operation is configured to make a plurality of frequency components of the pulse laser radiation beam emitted by the pulse shaping unit to be substantially in phase;
   a wavelength conversion unit, configured to conduct a center wavelength conversion operation to the pulse laser radiation beam; and
   a high-order harmonics generation unit, configured to receive the pulse laser radiation beam processed by the at least one pulse shaping unit and the center wavelength conversion operation, and configured to focus the received pulse laser radiation beam to a high order harmonic generation medium to generate a high order harmonic radiation beam.

2. The EUV radiation light source generation apparatus of claim 1, wherein the pulse laser radiation beam has a first bandwidth and a first pulse duration,
   the at least one pulse shaping unit conducts the spectrum extending operation so that the pulse laser radiation beam passed through the at least one pulse shaping unit has a second bandwidth greater than the first bandwidth,
   the at least one pulse shaping unit conducts the phase compensation operation so that the pulse laser radiation beam passed through the at least one pulse shaping unit has a second pulse duration smaller than the first pulse duration.

3. The EUV radiation light source generation apparatus of claim 1, wherein the pulse laser radiation beam has a first center wavelength,
   the wavelength conversion unit is configured to conduct the center wavelength conversion operation so that the pulse laser radiation beam passed through the wavelength conversion unit has a second center wavelength, and the first center wavelength is different from the second center wavelength.

4. The EUV radiation light source generation apparatus of claim 1, wherein the pulse laser radiation beam emitted by the at least one pulse shaping unit has a bandwidth smaller than or equal to an acceptance bandwidth of the wavelength conversion unit.

5. The EUV radiation light source generation apparatus of claim 1, wherein each of the at least one pulse shaping unit comprises a continuum unit configured to conduct the spectrum extending operation, and the continuum unit comprises:
   a plurality of condensed state transparent plates, arranged in sequence on an optical propagation path of the pulse laser radiation beam,
   wherein the plurality of condensed state transparent plates are separated by a plurality of predetermined distances, each of the plurality of predetermined distances is a distance between corresponding two adjacent condensed state transparent plates.

6. The EUV radiation light source generation apparatus of claim 1, wherein each of the at least one pulse shaping unit comprises a continuum unit configured to conduct the spectrum extending operation, and the continuum unit comprises a hollow core fiber or a multipass cell.

7. The EUV radiation light source generation apparatus of claim 1, wherein each of the at least one pulse shaping unit comprises a pulse compression unit configured to conduct the phase compensation operation, and the pulse compression unit comprises:
   a chirped mirror, wherein the chirped mirror comprises a plurality of coating layers,
   wherein each of the plurality of coating layer is configured to reflect a corresponding one of a plurality of frequency components of the pulse laser radiation beam received by the pulse compression unit.

8. The EUV radiation light source generation apparatus of claim 1, wherein a number of the at least one pulse shaping unit is substantially multiple, the wavelength conversion unit is arranged on an optical propagation path passing through the at least one pulse shaping unit, and the wavelength conversion unit is arranged between any two of the at least one pulse shaping unit.

9. The EUV radiation light source generation apparatus of claim 1, wherein a number of the at least one pulse shaping unit is substantially multiple, and the at least one pulse shaping unit is arranged behind the wavelength conversion unit.

10. The EUV radiation light source generation apparatus of claim 1, wherein each of the at least one pulse shaping unit respectively emits the pulse laser radiation beam having a pulse duration having a pulse compressing ratio smaller than or equal to 100.

11. The EUV radiation light source generation apparatus of claim 1, wherein a pulse compressing ratio of a pulse duration of the pulse laser radiation beam, emitted by the at least one pulse shaping unit, to a pulse duration of the pulse laser radiation beam, provided by the pump laser, is 20 to 1000.

12. The EUV radiation light source generation apparatus of claim 1, wherein a repetition rate of the pump laser is 1 kHz to 1 MHz.

13. An EUV radiation light source generating method, comprising:
utilizing a pump laser to provide a pulse laser radiation beam to an optical propagation path, wherein the pulse laser radiation beam has a first pulse duration;
conducting a center wavelength conversion operation on the optical propagation path, so as to convert a first center wavelength of the pulse laser radiation beam to a second center wavelength, wherein the first center wavelength is different from the second center wavelength;
conducting a first spectrum extending operation on the optical propagation path, so as to extend a first bandwidth of the pulse laser radiation beam to a second bandwidth, wherein the first bandwidth is smaller than the second bandwidth;
conducting a first phase compensation operation on the optical propagation path, wherein the first phase compensation operation is configured to make a plurality of frequency components of the pulse laser radiation beam having the second bandwidth substantially in phase, the pulse laser radiation beam processed by the first phase compensation operation has a second pulse duration, and the first pulse duration is greater than the second pulse duration; and
focusing the pulse laser radiation beam, processed by the first spectrum extending operation, the first phase compensation operation, and the center wavelength conversion operation, to a high order harmonic generation medium to generate a high order harmonic radiation beam.

14. The EUV radiation light source generating method of claim 13, wherein the first spectrum extending operation comprises utilizing a nonlinear effect, resulting from the pulse laser radiation beam passing through a medium, to extend a spectrum of the pulse laser radiation beam.

15. The EUV radiation light source generating method of claim 13, wherein the center wavelength conversion operation is conducted before the first spectrum extending operation.

16. The EUV radiation light source generating method of claim 13, wherein the center wavelength conversion operation is conducted after the first phase compensation operation.

17. The EUV radiation light source generating method of claim 13, further comprising:
when the center wavelength conversion operation is finished, conducting a second extending spectrum operation on the optical propagation path to make the pulse laser radiation beam has a third bandwidth, wherein the third bandwidth is greater than the second bandwidth; and
conducting a second phase compensation operation on the optical propagation path to compensation a phase of the pulse laser radiation beam having the third bandwidth, wherein the pulse laser radiation beam processed by the second phase compensation operation has a third pulse duration, and the third pulse duration is smaller than the second pulse duration,
wherein a pulse compressing ratio of a pulse duration of the pulse laser radiation beam, processed by the second phase compensation operation, to a pulse duration of the pulse laser radiation beam, provided by the pump laser, is 20 to 1000.

18. A defect detection system, comprising:
an EUV radiation light source generation apparatus, comprising:
a pump laser, configured to provide a pulse laser radiation beam;
at least one pulse shaping unit, wherein each one of the at least one pulse shaping unit is configured to conduct a spectrum extending operation and a phase compensation operation to the pulse laser radiation beam, and the phase compensation operation is configured to make a plurality of frequency components of the pulse laser radiation beam emitted by the pulse shaping unit to be substantially in phase;
a wavelength conversion unit, configured to conduct a center wavelength conversion operation to the pulse laser radiation beam; and
a high-order harmonics generation unit, configured to receive the pulse laser radiation beam processed by the at least one pulse shaping unit and the center wavelength conversion operation, and configured to focus the received pulse laser radiation beam to a high order harmonic generation medium to generate a high order harmonic radiation beam; and
a defect detection apparatus, comprising:
a testing platform, configured to set a sample under test, wherein the high order harmonic radiation beam is configured to be incident to the sample under test by a predetermined angle of incidence;
a detection unit, configured to detect a diffraction result of the high order harmonic radiation beam diffracting the sample under test; and
an analysis unit, electrically coupled to the detection unit, and configured to construct an image corresponding to the sample under test according to the diffraction result.

19. The defect detection system of claim 18, wherein the high order harmonic radiation beam, reflected by the sample under test, forms a reflected radiation beam which is non-focused, and the analysis unit constructs the image corresponding to the sample under test according to a coherent diffraction imaging and the reflected radiation beam.

20. The defect detection system of claim 18, wherein the high order harmonic radiation beam, reflected by the sample under test, forms a reflected radiation beam which is non-focused, and the defect detection apparatus further comprises a focusing unit configured to focus the reflected radiation beam.

21. The defect detection system of claim 18, wherein a pulse compressing ratio of a pulse duration of the pulse laser radiation beam, received by the high-order harmonics generation unit, to a pulse duration of the pulse laser radiation beam, provided by the pump laser, is 20 to 1000.

22. The defect detection system of claim 18, wherein a number of the at least one pulse shaping unit is substantially multiple, and the at least one pulse shaping unit is arranged behind the wavelength conversion unit.

* * * * *